(12) United States Patent
Lee et al.

(10) Patent No.: US 9,564,340 B2
(45) Date of Patent: Feb. 7, 2017

(54) METHOD OF MANUFACTURING SEMICONDUCTOR DEVICE

(71) Applicant: Samsung Electronics Co., Ltd., Suwon-si, Gyeonggi-do (KR)

(72) Inventors: Gi-bong Lee, Suwon-si (KR); Wook-hyun Kwon, Yongin-si (KR); Kyung-soo Kim, Hwaseong-si (KR); Seon-ah Nam, Seoul (KR); Yeon-ho Park, Seoul (KR); Nak-jin Son, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/956,609

(22) Filed: Dec. 2, 2015

(65) Prior Publication Data

US 2016/0225635 A1    Aug. 4, 2016

(30) Foreign Application Priority Data

Feb. 3, 2015   (KR) ........................ 10-2015-0016730

(51) Int. Cl.
    *H01L 21/30*    (2006.01)
    *H01L 21/308*   (2006.01)
    *H01L 29/66*    (2006.01)

(52) U.S. Cl.
    CPC ..... *H01L 21/3086* (2013.01); *H01L 29/66795* (2013.01)

(58) Field of Classification Search
    None
    See application file for complete search history.

(56) References Cited

U.S. PATENT DOCUMENTS

| | | | |
|---|---|---|---|
| 6,777,340 B1 * | 8/2004 | Chiu | H01L 21/3081 257/E21.232 |
| 7,250,658 B2 | 7/2007 | Doris et al. | |
| 7,545,008 B2 | 6/2009 | Chan et al. | |
| 7,910,443 B2 | 3/2011 | Cho | |
| 8,164,137 B2 | 4/2012 | Cho et al. | |
| 8,637,371 B2 | 1/2014 | Chang et al. | |
| 8,802,521 B1 * | 8/2014 | Hung | H01L 21/76229 257/347 |
| 9,269,628 B1 * | 2/2016 | Jacob | H01L 21/823431 |
| 2006/0177977 A1 | 8/2006 | Chan et al. | |
| 2006/0205224 A1 | 9/2006 | Huang et al. | |
| 2008/0199806 A1 * | 8/2008 | Hatakeyama | G03F 7/0035 430/270.1 |
| 2012/0208356 A1 | 8/2012 | Furukawa et al. | |

(Continued)

*Primary Examiner* — Charles Garber
*Assistant Examiner* — Alia Sabur
(74) *Attorney, Agent, or Firm* — Harness Dickey & Pierce

(57) ABSTRACT

A method of manufacturing a semiconductor device includes forming a plurality of active fins over a semiconductor substrate, sequentially forming first and second hard mask layers over the active fins, forming a first hard mask pattern by etching the second hard mask layer, trimming the first hard mask pattern to form a trimmed hard mask pattern, forming a first photo resist pattern over the first hard mask layer, forming second hard mask patterns by etching the first hard mask layer by using the trimmed hard mask pattern and the first photo resist pattern as an etching mask, and forming active fin patterns by etching the active fins by using the second hard mask patterns as an etching mask.

20 Claims, 39 Drawing Sheets

(56) References Cited

U.S. PATENT DOCUMENTS

| | | |
|---|---|---|
| 2013/0059441 A1 | 3/2013 | Kuo |
| 2013/0143372 A1 | 6/2013 | Kim et al. |
| 2013/0174103 A1* | 7/2013 | Shieh .............. H01L 21/823431 716/54 |
| 2013/0334614 A1 | 12/2013 | Liaw |
| 2014/0131813 A1* | 5/2014 | Liaw ................... H01L 27/1104 257/401 |
| 2014/0227857 A1* | 8/2014 | Youn ................ H01L 21/76229 438/427 |
| 2014/0256144 A1* | 9/2014 | Lo ................... H01L 21/823431 438/703 |
| 2014/0299973 A1 | 10/2014 | Lin |
| 2014/0306272 A1 | 10/2014 | Kuo et al. |
| 2015/0243667 A1* | 8/2015 | Liaw ................... H01L 27/1104 257/390 |
| 2015/0255299 A1* | 9/2015 | Cantone .............. H01L 21/3085 438/702 |
| 2016/0056045 A1* | 2/2016 | Huang ................ H01L 21/308 257/623 |
| 2016/0124300 A1* | 5/2016 | Ho ....................... H01L 21/845 430/5 |

\* cited by examiner

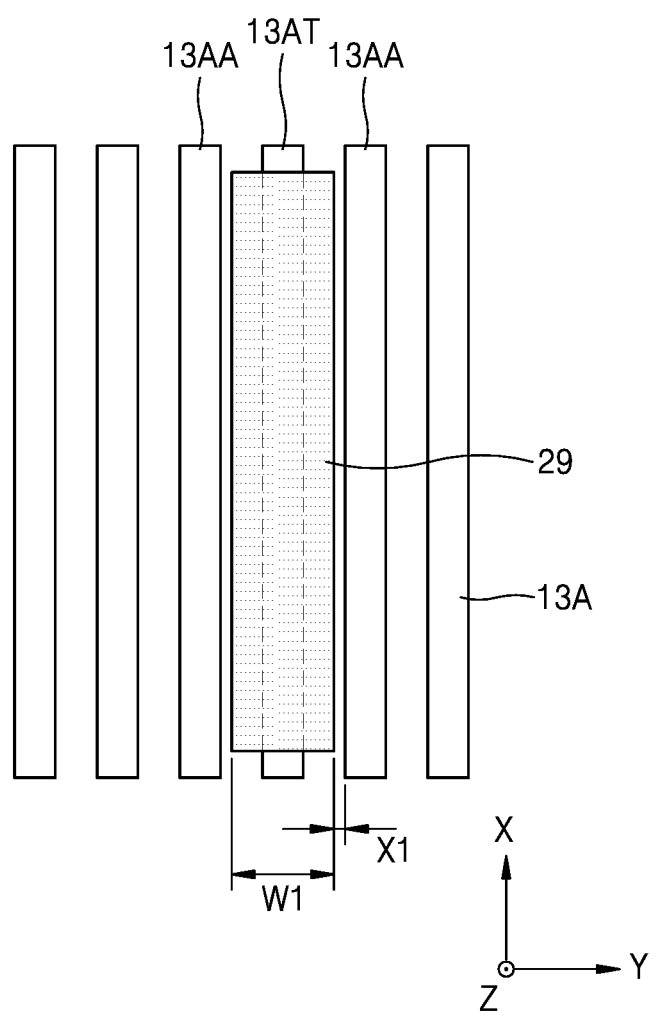

METHOD OF MANUFACTURING SEMICONDUCTOR DEVICE

CROSS-REFERENCE TO RELATED APPLICATION

This application claims the benefit of Korean Patent Application No. 10-2015-0016730, filed on Feb. 3, 2015, in the Korean Intellectual Property Office, the disclosure of which is incorporated herein in its entirety by reference.

BACKGROUND

1. Field

At least one example embodiment of the inventive concepts, relates to a method of manufacturing a semiconductor device and/or a method of manufacturing a semiconductor device including a fin-type field effect transistor (FinFET).

2. Description of the Related Art

As semiconductor devices have become highly integrated, a gate length of a field effect transistor (FET) has gradually become shorter. Accordingly, in order to overcome the limitations of a planar-type metal oxide semiconductor FET (MOSFET), efforts to develop semiconductor devices including a FinFET with a channel having a 3-dimensional structure have been made.

SUMMARY

At least one example embodiment of the inventive concepts provide a method of manufacturing a semiconductor device, whereby a degree of freedom in designing the semiconductor device may be improved by forming the hard mask pattern for patterning a single active fin, and a decrease in critical dimension uniformity (CDU) of the hard mask pattern may be prevented and/or reduced.

According to at least one example embodiment of the inventive concepts, there is provided a method of manufacturing a semiconductor device. The method includes: forming a plurality of active fins over a semiconductor substrate; sequentially forming first and second hard mask layers over the active fins; forming a first hard mask pattern by etching the second hard mask layer; trimming the first hard mask pattern to form a trimmed hard mask pattern; forming a first photo resist pattern over the first hard mask layer; forming second hard mask patterns by etching the first hard mask layer by using the trimmed hard mask pattern and the first photo resist pattern as an etching mask; and forming active fin patterns by etching the active fins by using the first hard mask patterns as an etching mask.

In at least one example embodiment, the trimmed hard mask pattern may include at least one unit mask pattern, in which the unit mask pattern may overlap an active fin from among the active fins.

In at least one example embodiment, a plurality of the unit mask patterns may be formed and the unit mask patterns may respectively overlap the active fins that are separated from each other and between which at least two of the active fins are interposed In at least one example embodiment, the trimmed hard mask pattern may completely overlap an upper surface of the active fin along a line width direction of the active fin.

In at least one example embodiment, a line width of the trimmed hard mask pattern may be less than a line width of the first hard mask pattern.

In at least one example embodiment, the first photo resist pattern may include at least one unit resist pattern, in which the unit resist pattern may overlap at least two of the active fins.

In at least one example embodiment, the line width of the trimmed hard mask pattern may be less than pitches between the active fins.

In at least one example embodiment, the first photo resist pattern may be formed to partially overlap the trimmed hard mask.

In at least one example embodiment, the second hard mask patterns may be divided into a second pattern region defined by the trimmed hard mask pattern; and a first pattern region not including the second pattern region from among the second hard mask patterns, in which a line width of the second pattern region may be equal to or less than a half of a line width of the first pattern region.

In at least one example embodiment, the active fins forming the active fin patterns may extend in parallel with each other along a first direction, and the active fin patterns may be divided into a second active fin region overlapping the trimmed hard mask pattern; and a first active fin region not including the second active fin region from among the active fin patterns, in which an end of the first direction in the second active fin region may project more than an end of the first direction in the first active fin region.

In at least one example embodiment, the second hard mask patterns may have one of an L shape, a C shape, and an H shape.

In at least one example embodiment, the method may further include forming, after the forming of the active fin patterns, a gate electrode crossing at least one of the active fin patterns.

In at least one example embodiment, the active fin patterns may be divided into: the second active fin region overlapping the trimmed hard mask pattern; and the first active fin region not including the second active fin region from among the active fin patterns, in which a plurality of the gate electrodes may be formed. At least one of the gate electrodes may cross both of the first and second active fin regions, and at least one of the gate electrodes may cross any one of the first or second active fin regions.

In at least one example embodiment, the forming a first hard mask pattern may include: forming a third hard mask layer over the second hard mask layer, and further forming a third hard mask pattern by etching the third hard mask layer; performing a pre-trimming process over the third hard mask pattern; and forming a second photo resist pattern over the second hard mask layer, and further forming the first hard mask pattern by etching the second hard mask layer by using a pre-trimmed third hard mask pattern and the second photo resist pattern as an etching mask.

In at least one example embodiment, the active fins may extend in parallel with each other along the first direction, and the trimmed hard mask pattern may be divided into: a third pattern region overlapping the pre-trimmed third hard mask pattern; and a fourth pattern region not including the third pattern region from the trimmed hard mask pattern, in which the third and fourth pattern regions may overlap two of the active fins, respectively.

In at least one example embodiment, the two active fins may be separated from each other and at least one active fin may be interposed therebetween.

According to at least one example embodiment of the inventive concepts, there is provided a method of manufacturing a semiconductor device. The method includes: forming a hard mask layer over active fins; forming a hard mask pattern completely overlapping one of the active fins along a line width direction over the hard mask layer; trimming the hard mask pattern so as to have a first line width; forming a photo resist pattern overlapping at least two active fins over the hard mask layer and having a second line width greater than the first line width; and patterning the active fins by using the trimmed hard mask pattern and the photo resist pattern as an etching mask.

In at least one example embodiment, of the inventive concepts, there is provided a method of manufacturing a semiconductor device. The method includes: sequentially forming over a semiconductor substrate on which active fins are formed a final hard mask layer and a preliminary hard mask pattern configured to be patterned by at least one hard mask layer; trimming the preliminary hard mask pattern; forming a photo resist pattern over the final hard mask layer; forming a final hard mask pattern by using the trimmed preliminary hard mask pattern and the photo resist pattern as an etching mask; and etching the active fin by using the final hard mask pattern as an etching mask.

In at least one example embodiment, the trimmed preliminary hard mask pattern may overlap one of the active fins.

In at least one example embodiment, the photo resist pattern may overlap at least two of the active fins.

In at least one example embodiment, the method may include forming a plurality of active fins on a substrate, forming a hard mask layer over a targeted one of the plurality of active fins, and forming a first hard mask pattern over the hard mask layer, the first hard mask pattern having a width that covers only the targeted one of the active fins.

In at least one example embodiment, the method may also include forming a plurality of hard mask patterns simultaneously to the forming a first hard mask pattern, each of the plurality of hard mask patterns covering at least a selected one of the plurality of active fins. A line width of each of the plurality of hard mask patterns is greater than or equal to a line width of the selected one of the plurality of active fins. The plurality of hard mask patterns may not trimmed. In at least one example embodiment, the method may also include trimming at least one of the plurality of hard mask patterns.

BRIEF DESCRIPTION OF THE DRAWINGS

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

DETAILED DESCRIPTION OF THE EMBODIMENTS

Figure 1:
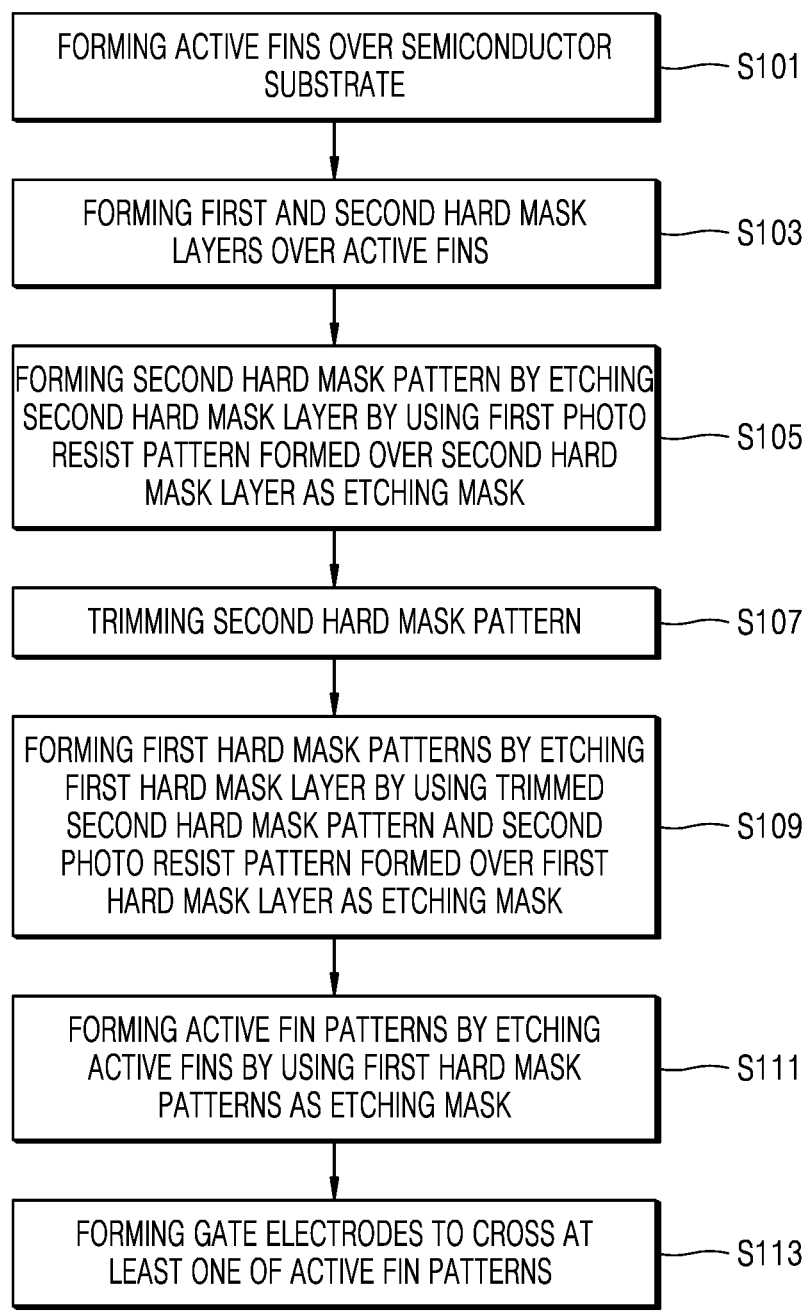
FIG. 1 is a flow chart of a method of manufacturing a semiconductor device, according to at least one example embodiment of the inventive concepts.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a flow chart of a method of manufacturing a semiconductor device, according to at least one example embodiment of the inventive concepts. FIGS. 2 to 11 are perspective views, planar layouts, and sectional views illustrating a method of manufacturing a semiconductor device in a process sequence, according to at least one example embodiment of the inventive concepts. FIGS. 4B, 5B, 6B, 7B, and 8B illustrate planar layouts of FIGS. 4A, 5A, 6A, 7A, and 8A respectively, and FIG. 4C, FIG. 5C, FIG. 6C, and FIG. 7C illustrate sectional views taken along lines IV-IV, V-V, VI-VI, and VII-VII of FIGS. 4A, 5A, 6A, and 7A respectively. An identical reference symbol may represent an identical member and overlapping contents will be described in a simplified manner.

Figure 2:
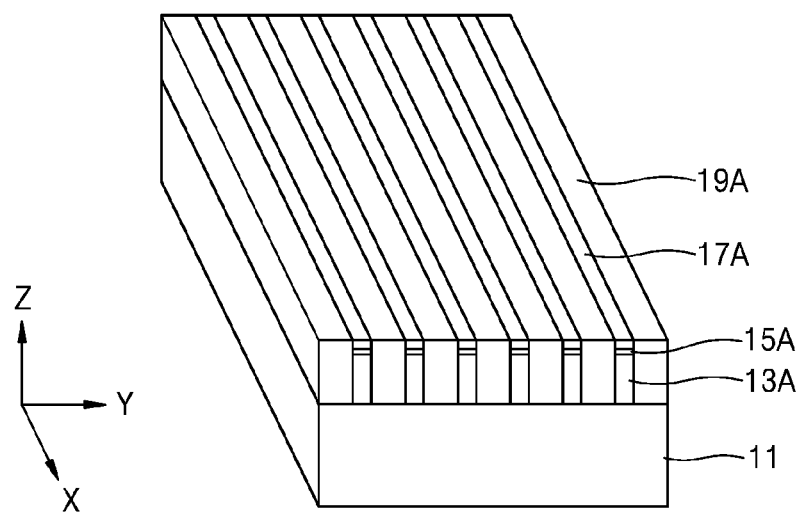
FIGS. 2 to 11 are perspective views, planar layouts, and sectional views illustrating a method of manufacturing a semiconductor device in a process sequence, according to at least one example embodiment of the inventive concepts.

Referring to FIGS. 1 and 2, a plurality of active fins 13A are formed to project from a semiconductor substrate 11 during step S101. In other words, the plurality of active fins 13A are formed by etching the semiconductor substrate 11 by using the first and second insulating films 15A and 17A.

In detail, the first and second insulating films 15A and 17A are preliminarily formed over the semiconductor substrate 11. The semiconductor substrate 11 may include silicon, such as crystalline silicon, polycrystalline silicon, or amorphous silicon. In at least one example embodiment, the semiconductor substrate 11 may include germanium or a compound semiconductor, such as silicon germanium, silicon carbide, gallium arsenide, indium arsenide, or indium phosphide. In at least one example embodiment, the semiconductor substrate 11 may have silicon on insulator (SOI) structure. For example, the semiconductor substrate 11 may include a buried oxide (BOX) layer. In at least one example embodiment, the semiconductor substrate 11 may include a conductive region, for example, a well doped with an impurity, or a structure doped with an impurity.

In at least one example embodiment, the first insulating films 15A may be preliminarily formed as an oxide film, for example, silicon oxide ($SiO_2$). In at least one example embodiment, the second insulating film 17A may be preliminarily formed as a nitride film, for example, silicon nitride (SiN). In at least one example embodiment, the first and second insulating films 15A and 17A may be preliminarily formed by a chemical vapor deposition (CVD) process. In at least one example embodiment, the preliminary forming of the first and second insulating films 15A and 17A over the semiconductor substrate 11 may be omitted.

In at least one example embodiment, a plurality of mask patterns defining the active fins 13A may be formed over the second insulating films 17A. The plurality of mask patterns may include a plurality of line patterns repeatedly formed with a constant pitch. The mask patterns may be formed by forming a mask layer on the second insulating films 17A and etching the mask layer by using a photoresist pattern, which is formed through a typical photolithography process, a double patterning technology (DPT) and/or a quadruple patterning technology (QPT), as an etching mask. Afterwards, a plurality of element isolation trenches may be formed by etching the semiconductor substrate 11, the first insulating films 15A, and the second insulating films 17A by using the mask patterns as an etching mask. The active fins 13A may be formed as a part of the semiconductor substrate 11 by forming the element isolation trenches.

First element isolation films 19A may be preliminarily filled between the element isolation trenches, and the first element isolation films 19A are flattened until an upper surface of the second insulating films 17A is exposed to thus form first element isolation films 19A. The first element isolation films 19A may include oxide film, nitride film, or a combination thereof.

Figure 3:
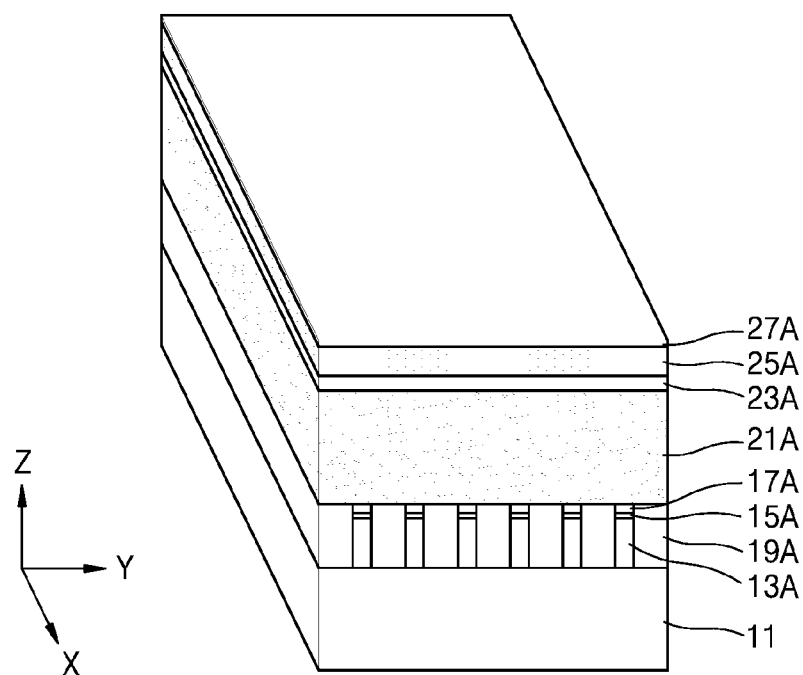

Referring to FIGS. 1 and 3, a first hard mask layer 21A, a first intermediate layer 23A, a second hard mask layer 25A, and a second intermediate layer 27A may be sequentially formed over the second insulating films 17A formed over the active fins 13A during step S103.

In some example embodiments, the first hard mask layer 21A and the second hard mask layer 25A may comprise a carbon-containing film, a spin-on organic hard mask (SOH mask), an amorphous carbon layer (ACL layer), an oxide film, or a nitride film. The SOH layer may comprise an organic compound comprising a hydrocarbon compound including an aromatic ring, such as phenyl, benzene, or naphthalene, or its derivatives. The SOH mask may be formed by a spin coating process.

In some example embodiments, the first hard mask layer 21A may be formed over the second insulating films 17A but the example embodiments of the inventive concepts are not limited thereto. In at least one example embodiment, upper surfaces of the active fins 13A may be exposed by removing a part of an upper side in the first element isolation films 19A, the second insulating films 17A, and the first insulating films 15A. Accordingly, the first hard mask layer 21A may be formed over the active fins 13A.

The first intermediate layer 23A may be formed over the first mask layer 21A. The first intermediate layer 23A may be formed by an atomic layer deposition (ALD) process. The first intermediate layer 23A may play a role of an antireflection film so that light may not be reflected in a patterning process of a photo resist layer on the first mask layer 21A. The second intermediate layer 27A may be formed over the second mask layer 25A. The second hard mask layer 27A may include silicon oxy-nitride (SiON).

Referring to FIG. 1 and FIGS. 4A to 4C, a first photo resist pattern 29 may be formed over the second intermediate layer 23A. The first photo resist pattern 29 may be formed so as to overlap an active fin 13AT from among the active fins 13A on the semiconductor substrate 11. The first photo resist pattern 29 may be formed by a typical photo lithography process. In some example embodiments, an ArF immersion method or EUV exposure equipment may be used in the photo lithography process. However, due to optical characteristics such as diffraction, it is difficult to form the first photo resist pattern 29 so as to overlap the active fin 13AT from among the active fins 13A having a narrow pitch. In other words, even if process conditions are set so as to overlap only the active fin 13AT, a line width W1 of the first photo resist pattern 29 may be formed greater than a designed size. Thus, a distance X1 between the first photo resist pattern 29 and the active fins 13AA adjacent to the first photo resist pattern 29 is very short, and as a result, the first photo resist pattern 29 and the adjacent active fins 13AA may overlap when a small misalignment in a subsequent process occurs.

Figure 4A:
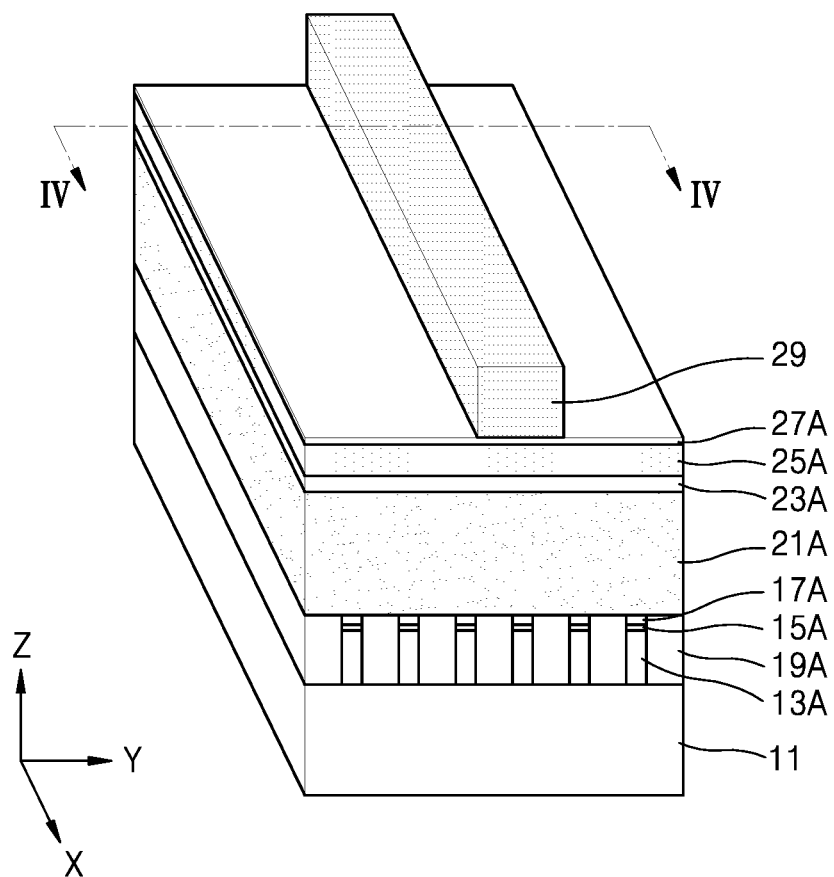
Figure 4C:
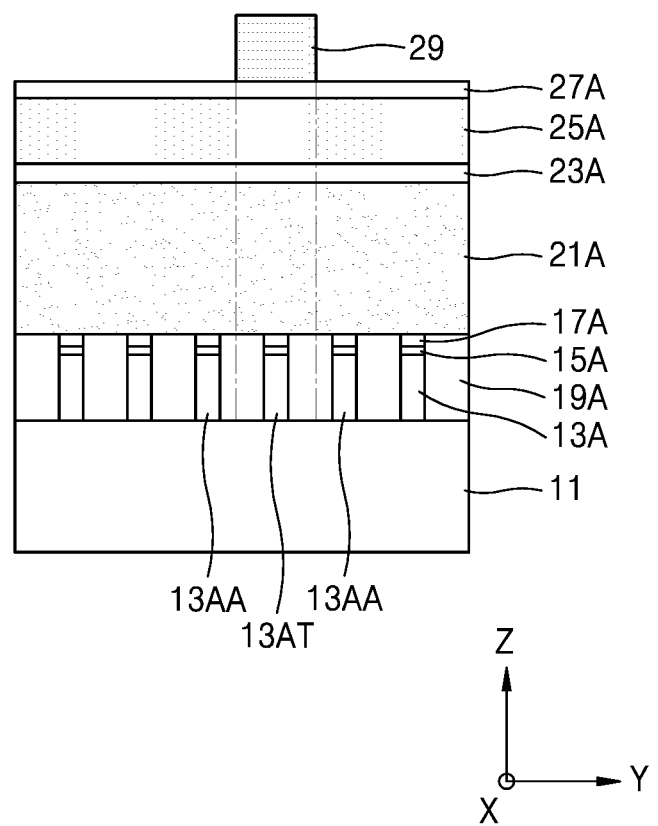

The first photo resist pattern 29 overlaps only the active fin 13AT in FIGS. 4A to 4C but technical ideas of example embodiments of the inventive concepts are not limited thereto. In at least one example embodiment, the first photo resist pattern 29 may be formed of various patterns according to a shape of individual unit element. This will be described in FIGS. 12A to 12D below.

Referring to FIG. 1 and FIGS. 5A to 5C, a second hard mask pattern 25B and a second intermediate pattern 27B may be formed by etching the second hard mask layer 25A and the second intermediate layer 27A by using the first photo resist pattern 29 of FIGS. 4A to 4C as an etching mask during step S105.

A line width W2 of the second hard mask pattern 25B and the second intermediate pattern 27B may be formed to be similar to the line width W1 of the first photo resist pattern 29. Accordingly, a distance X2 between the second hard mask pattern 25B and the active fins 13AA adjacent to the second hard mask pattern 25B on a plane may be very short. Therefore, the second hard mask pattern 25B and the adjacent active fins 13AA may overlap when a small misalignment in a process occurs.

Figure 5A:
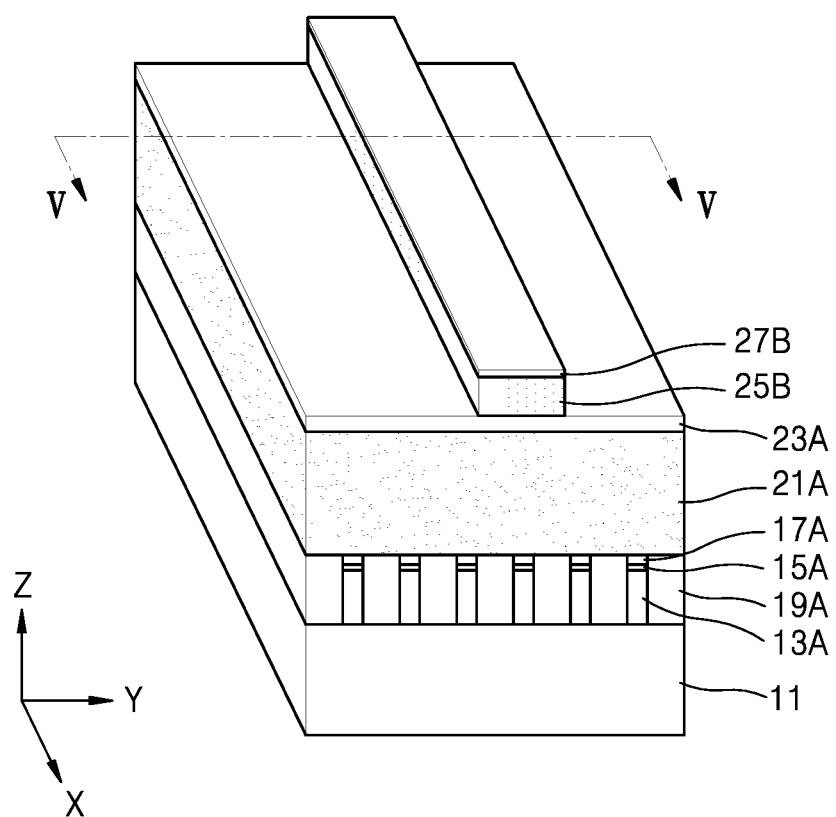
Figure 5B:
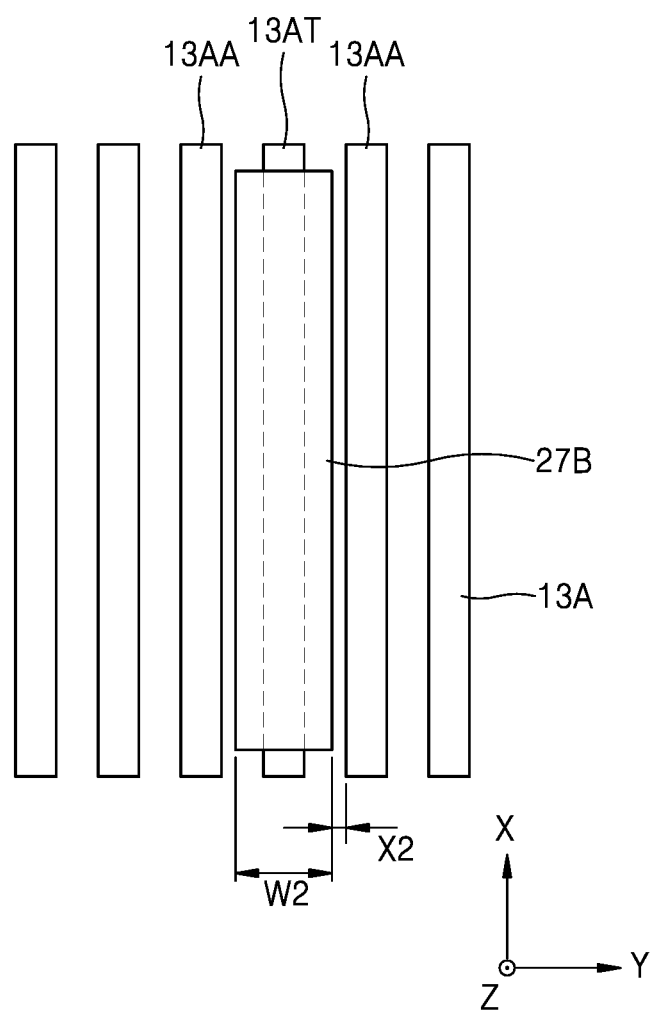
Figure 5C:
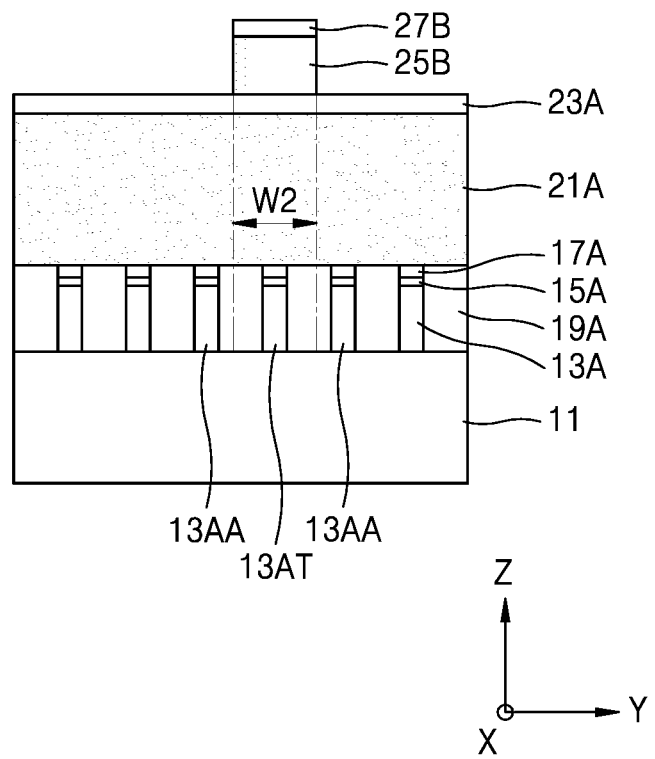
Figure 6A:
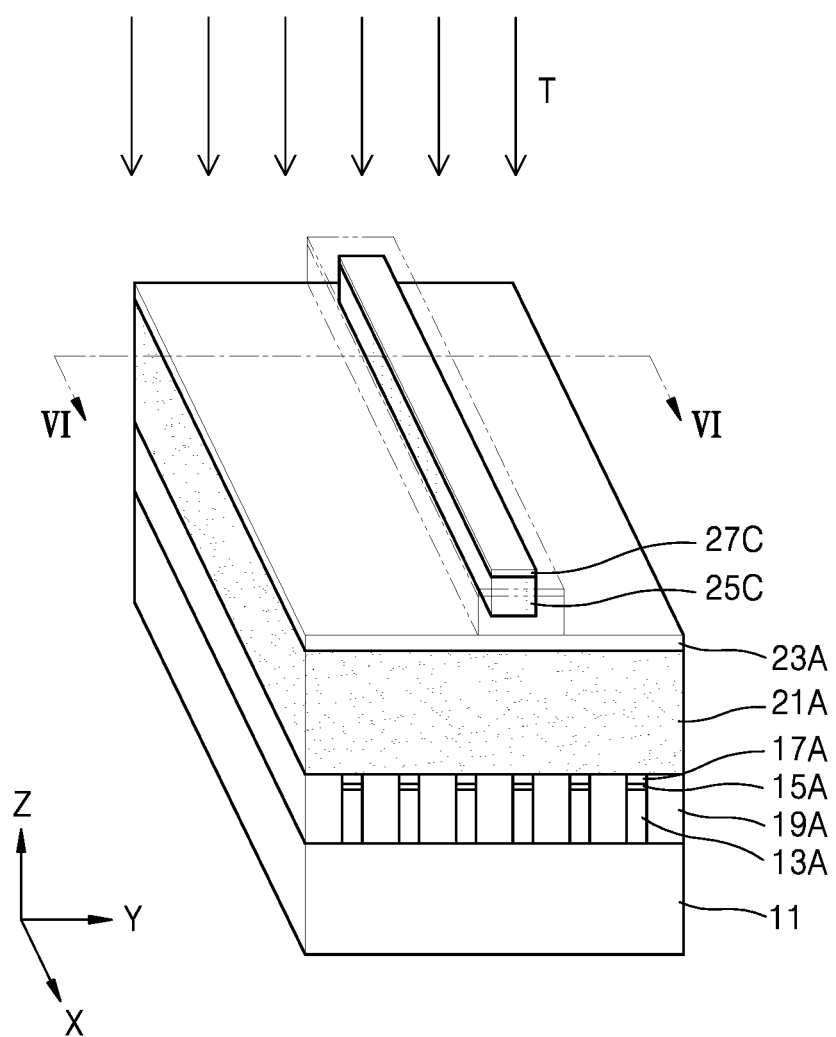
Figure 6B:
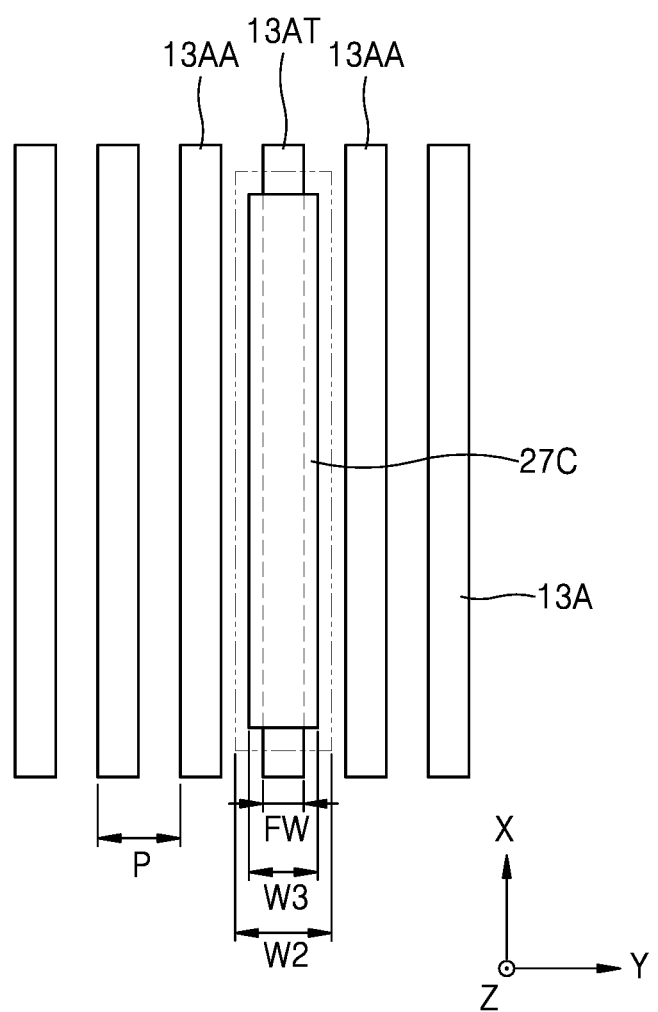
Figure 6C:
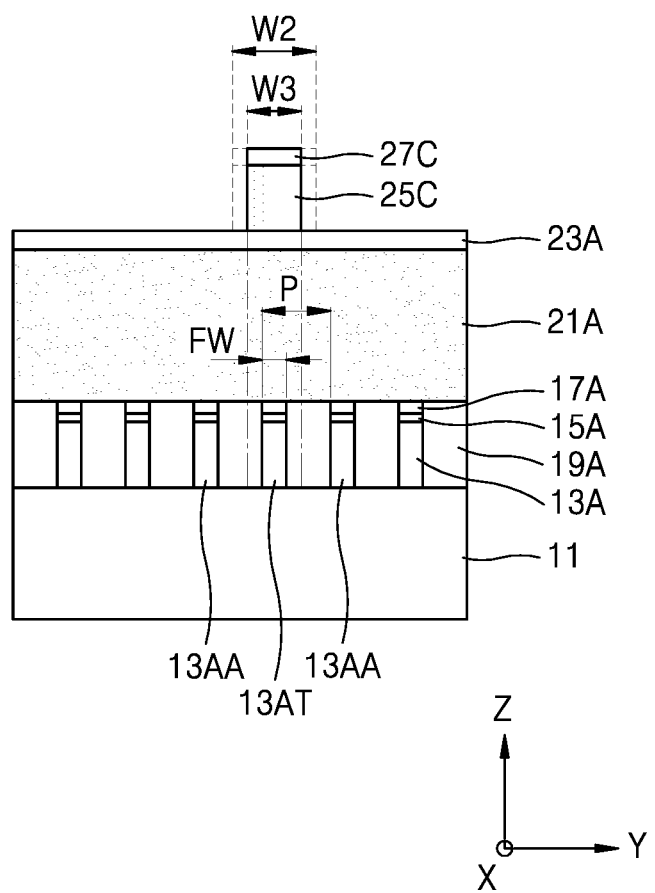

Referring to FIG. 1 and FIGS. 6A to 6C, a trimming process T is performed over the second hard mask pattern 25B and the second intermediate pattern 27B of FIGS. 5A to 5C during step S107. The trimming process T may reduce the line width W2 and a length of the second hard mask pattern 25B and the second intermediate pattern 27B of FIGS. 5A to 5C. A line width W3 of a trimmed second hard mask pattern 25C and a trimmed second intermediate pattern 27C may be narrower than the line width W2 of FIGS. 5A to 5C. Accordingly, the trimmed second hard mask pattern 25C may be formed so as to overlap only a targeted active fin 13AT from among the active fins 13A.

When an active fin 13AT is to be patterned from among the active fins 13A having a narrow pitch, it is necessary and/or desired to form a hard mask pattern overlapping the active fin 13AT. The second hard mask pattern 25B of FIGS. 5A to 5C may be formed by the photo resist pattern 29 of FIGS. 4A to 4C. However, due to the optical characteristics of the photo lithography process, it is difficult to form the photo resist pattern 29 so as to overlap only the active fin 13AT, as described above. The photo resist pattern 29 is formed to have the line width W1 which is wide enough to be very close to or to overlap the adjacent active fins 13AA, and the line width W1 may be directly reflected onto the second hard mask pattern 25B of FIGS. 5A to 5C. As a result, active fin patterns may not be formed as initially designed due to overlapping not only the active fin 13AT but also the active fins 13AA.

Thus, referring to FIGS. 7A to 8B described below, a method of manufacturing a semiconductor device according to at least one example embodiment of the inventive concepts uses the trimming process T to reduce the line width of the second hard mask pattern 25B of FIGS. 5A to 5C so as to overlap only the targeted active fin 13AT. At the same time, when a width of a hard mask pattern is enough wide to cover only a targeted range of the active fins 13A, a hard mask pattern forming operation without trimming may be introduced as a subsequent process of the trimming process T. As described above, in the method of manufacturing the semiconductor device according to at least one example embodiment of the inventive concepts, the trimming process T may be selectively performed according to an object to be patterned. Therefore, hard mask patterns having a narrow line width may be simultaneously formed and a decrease in critical dimension uniformity (CDU) of the hard mask patterns by omitting the trimming process of all the hard mask patterns may be prevented and/or reduced. Furthermore, the degree of freedom in designing the semiconductor device may be improved by patterning the active fin 13AT.

In at least one example embodiment, the trimming process T may be performed until the line width W3 of the trimmed second hard mask pattern 25C is equal to or greater than a line width FW of the active fins 13A. As a result, the trimmed second hard mask pattern 25C may be formed so as to completely overlap an upper surface of the active fin 13AT along a line width direction (Y direction) of the active fin 13AT.

In at least one example embodiment, the line width W3 of the trimmed second hard mask pattern 25C may be less than a pitch P of the active fins 13A.

Referring to FIG. 1 and FIGS. 7A to 7C, a second photo resist pattern 31 may be formed on a first intermediate layer 23A. The second photo resist pattern 31 may be formed in a range of the active fins 13A whose line width is out of the question so that may overlap, i.e. at least two active fins 13AT'. The second photo resist pattern 31 overlapping the at least two active fins 13AT has a relatively wide line width W4, and thus, may be less affected by optical characteristics of a photo lithography process. Therefore, the second photo resist pattern 31 may have the line width W4 as initially designed without a trimming process. As a result, a distance Y between the targeted active fin 13AT' and an active fin 13AA' adjacent to the targeted active fins 13AT' may be maintained relatively wide.

In at least one example embodiment, a part of the second photo resist pattern 31 may partially overlap the trimmed second hard mask pattern 25C formed on the first intermediate layer 23A.

In at least one example embodiment, the first intermediate layer 23A on the first hard mask layer 21A may be removed, and in this case, the second photo resist pattern 31 may be directly formed over the first hard mask layer 21A.

Figure 7A:
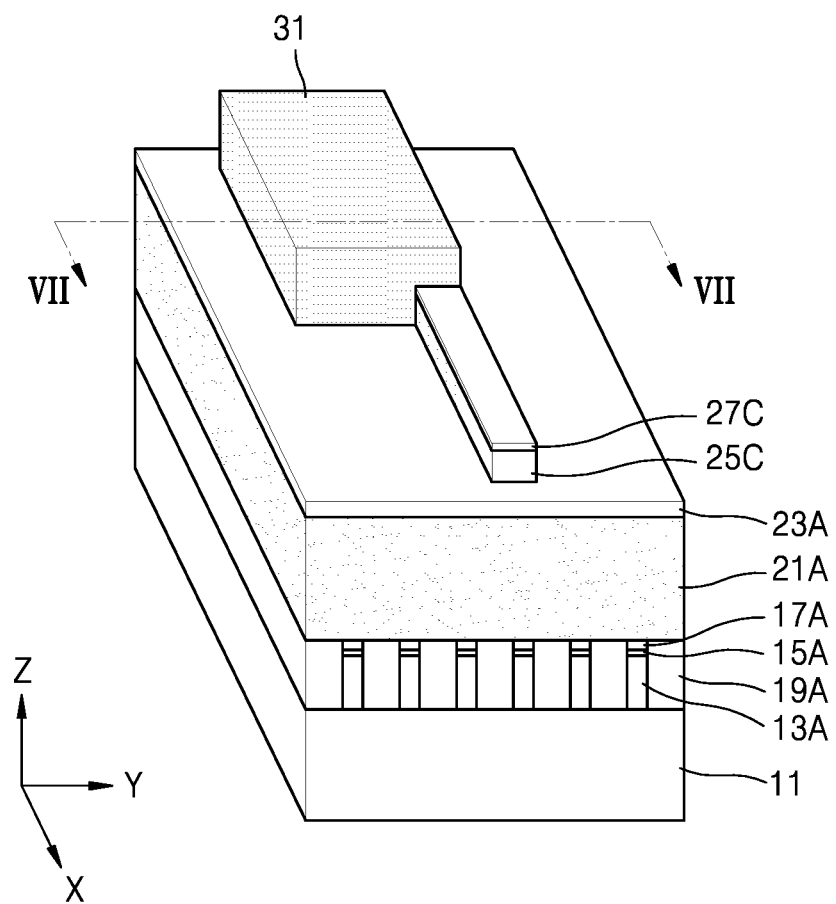
Figure 7B:
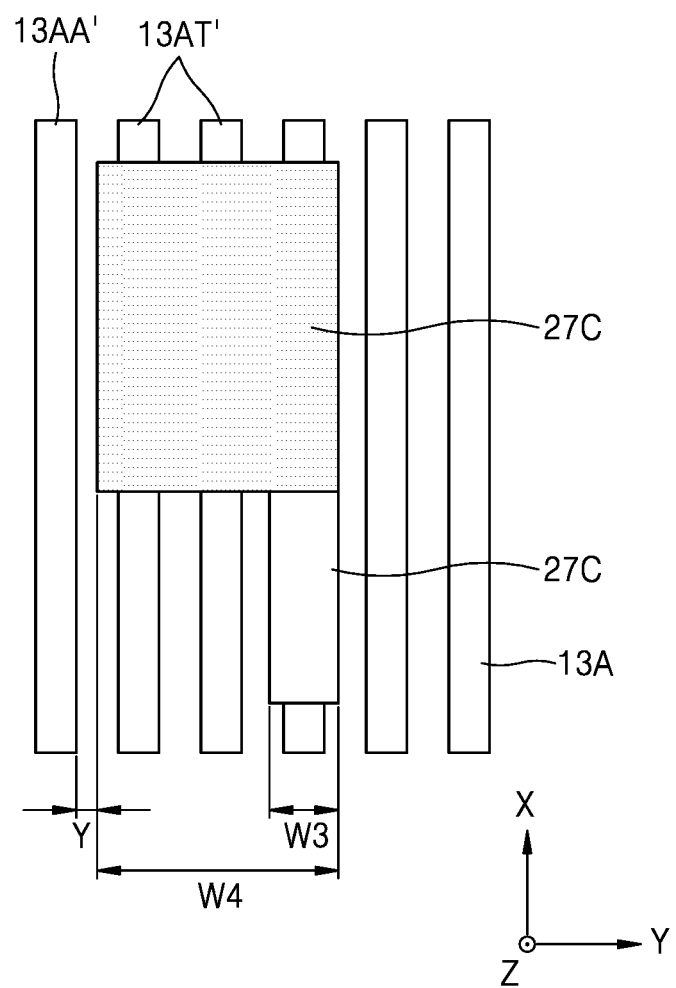
Figure 7C:
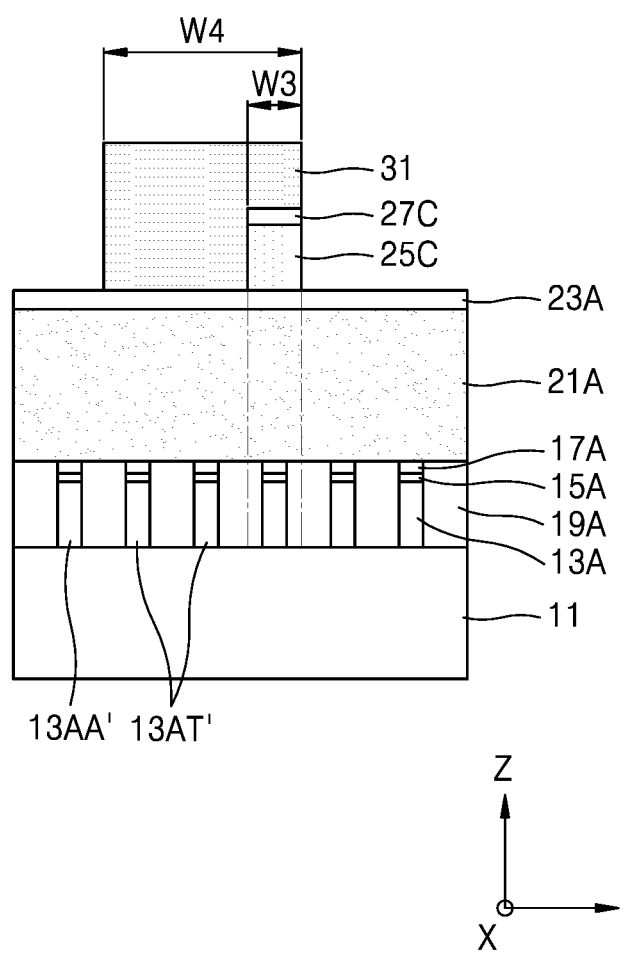

Referring to FIG. 1 and FIGS. 8A to 8C, first hard mask patterns 21B may be formed by etching the first hard mask layer 21A and the first intermediate layer 23A by using the second photo resist pattern 31 and the trimmed second hard mask pattern 25C of FIGS. 7A to 7C as an etching mask during step S109. The first hard mask patterns 21B may be divided into a first pattern region 21B1 defined by the trimmed second hard mask pattern 25C of FIGS. 7A to 7C, and a second pattern region 21B2 not including the first pattern region 21B1 from among the first hard mask patterns 21B, in which an end of a first direction (X direction) in the first pattern region 21B1 may project more than an end of the first direction in the second pattern region 21B2.

In at least one example embodiment, a line width W3 of the first pattern region 21B1 may be equal to or less than a half of a line width W5 of the second pattern region 21B2.

The first and second pattern regions 21B1 and 21B2 of the first hard mask patterns 21B may be formed of various patterns according to a shape of individual unit element. In at least one example embodiment, the first hard mask patterns 21B may have an L shape, a C shape, or an H shape. This will be described in FIGS. 12A to 12D below.

Figure 8A:
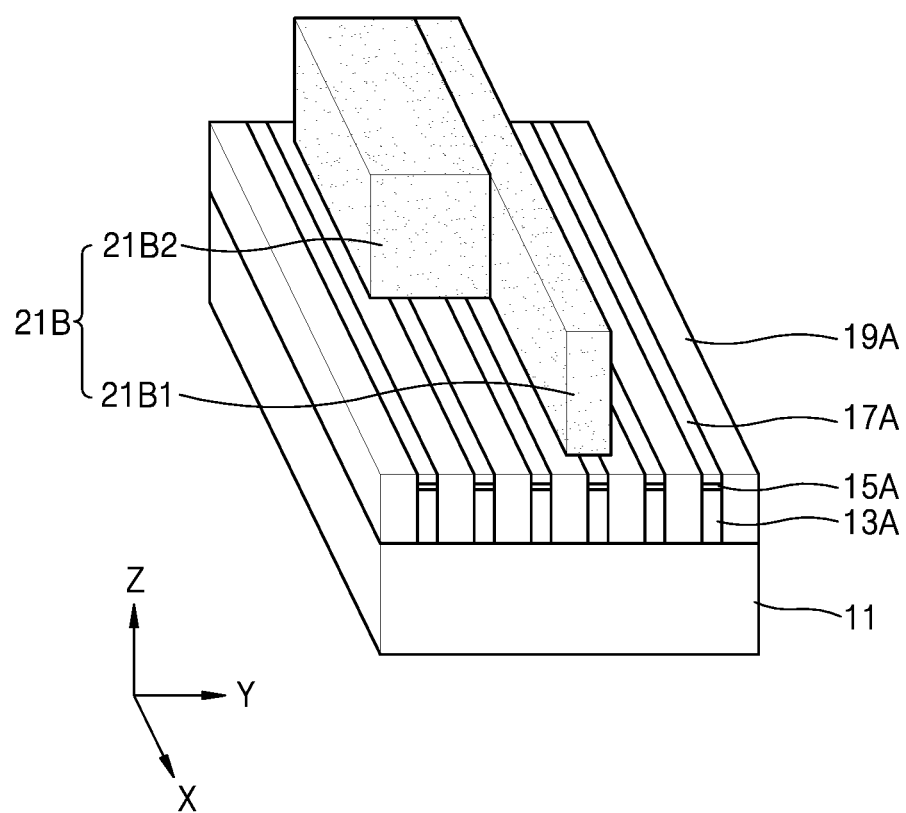
Figure 8B:
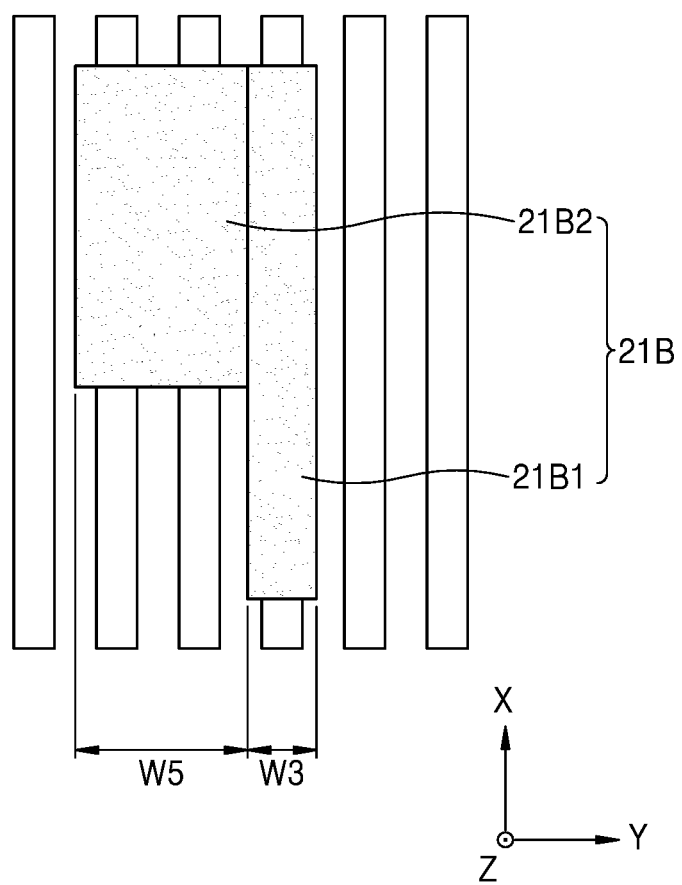
Figure 9:
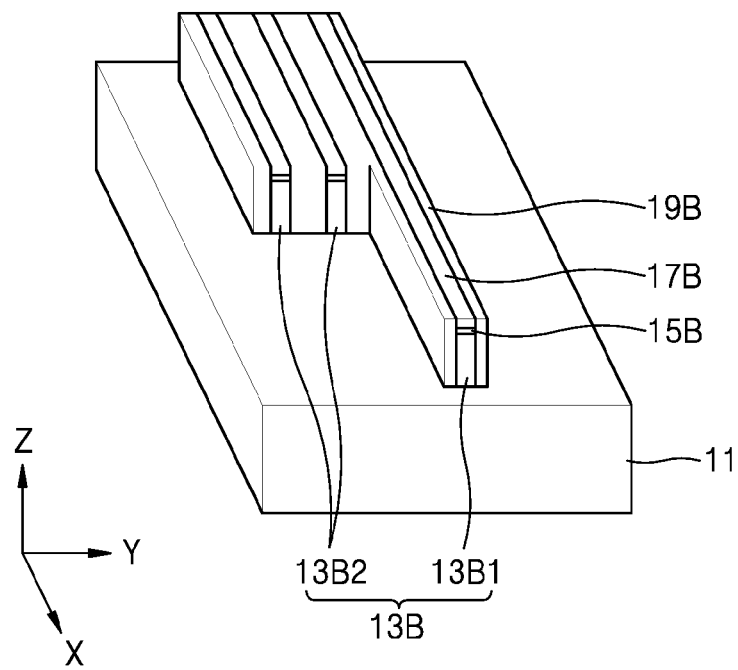

Referring to FIG. 1 and FIG. 9, active fins 13A, first insulating films 15A, second insulating films 17A, and first element isolation films 19A may be etched by using the first hard mask patterns 21B of FIGS. 8A to 8C as an etching mask. Therefore, active fin patterns 13B, first and second insulating patterns 15B and 17B formed on the active fin patterns 13B, and a first element isolation pattern 19B that overlaps sidewalls of the active fin patterns 13B may be formed on a semiconductor substrate 11 during step S111. The active fin patterns 13B may include two active fins 13B2 and an active fin 13B1 having a respective end that projects more than a respective end of the two active fins 13B2.

In at least one example embodiment, when an etching process of the active fins 13A by using the first hard mask patterns 21B of FIGS. 8A to 8C as an etching mask is performed, an upper surface of the semiconductor substrate 11 may be partially etched.

Figure 10:
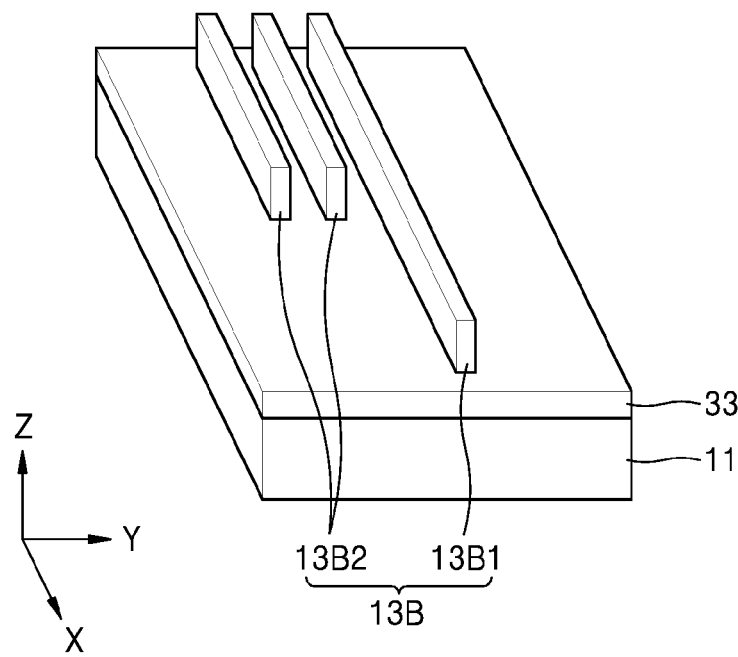

Referring to FIGS. 1 and 10, a second element isolation film 33 may be filled between the active fin patterns 13B while overlapping the upper surface of the semiconductor substrate 11.

In detail, in order to overlap the sidewalls of the active fin patterns 13B and the first element isolation pattern 19B of FIG. 9, a second element isolation film is preliminarily formed over the semiconductor substrate 11 from same material as used to form the second element isolation film 33. Moreover, an upper surface of the second insulating pattern 17B is exposed by flattening the second element isolation film. The second insulating pattern 17B may play a role as an etching stop film. Afterwards, an impurity is implanted from an upper side of the semiconductor substrate 11 to the active fin patterns 13B through the second insulating pattern 17B, and thus, the active fin patterns 13B may be doped with the impurity. The impurity may be, for example, p- or n-type conductive ions. The active fin patterns 13B may be doped with the p- or n-type conductive ions by implantation of the impurity. In some example embodiments, p- or n-type wells may be formed in the active fin patterns 13B through the implantation of the impurity.

Next, by removing the first element isolation pattern 19B of FIG. 9 overlapping the sidewalls of the active fin patterns 13B and a part of an upper side of the second element isolation film, the sidewalls of the active fin patterns 13B are exposed and the second element isolation film 33 may be formed. The first and second insulating patterns 15B and 17B formed on the active fin patterns 13B of FIG. 9 may be removed.

In some example embodiments, the second element isolation film 33 may be a single or a multilayer. The second element isolation film 33 may include an oxide film. In some example embodiments, the second element isolation film 33 may be preliminarily removed by a dry-etching process using plasma.

In some example embodiments, in a process of forming a gate electrode as will be described below in FIG. 11, portions that are not overlapped by gate electrodes 37A1 and 37A2 in the active fin patterns 13B may be defined as a source/drain area. An impurity may be additionally implanted in the source/drain area.

Figure 11:
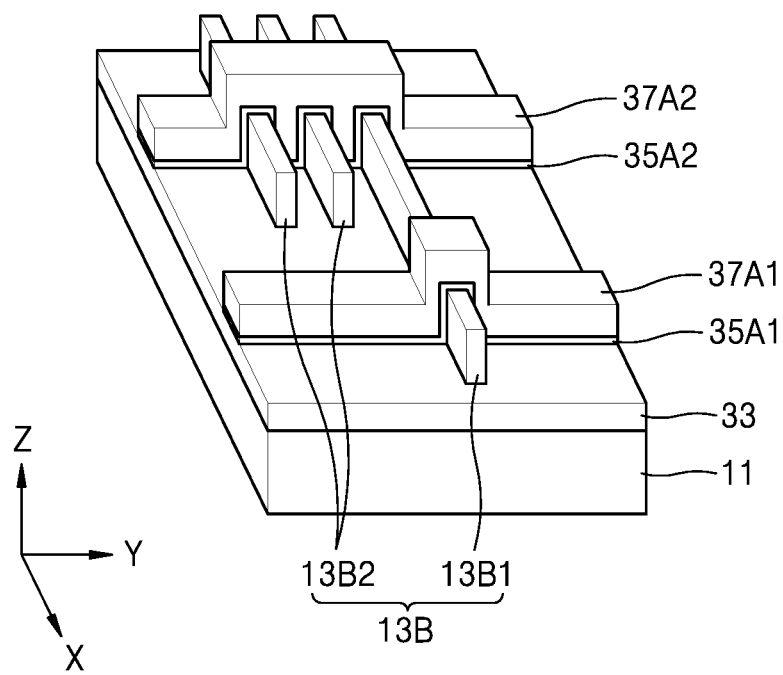

Referring to FIGS. 1 and 11, the gate electrodes 37A1 and 37A2 may be formed in a direction (Y direction) to cross at least one of the active fin patterns 13B during step S113. In other words, the gate electrodes 37A1 and 37A2 may be formed to overlap an upper surface of second element isolation film 33, and an upper surface and the sidewalls of the active fin patterns 13B. Gate insulating layers 35A1 and 35A2 may be formed under lower surfaces of the gate electrodes 37A1 and 37A2.

The active fin patterns 13B may be divided into a first active fin 13B1 overlapping the trimmed second hard mask pattern 25C, and second active fins 13B2 not including the first active fin 13B1 from among the active fin patterns 13B. The first gate electrode 37A1 and the first gate insulating layer 35A1 may be formed to cross only the first active fin 13B1. The second gate electrode 37A2 may be formed to cross the first and second active fins 13B1 and 13B2.

In some example embodiments, a plurality of the gate electrodes 37A1 and 37A2 are formed. At least the gate electrode 37A2 may cross the first and second active fins 13B1 and 13B2, and at least the gate electrode 37A1 may cross the first active fin 13B1 or the second active fins 13B2. In some example embodiments, three or more of the gate electrodes 37A1 and 37A2 are formed over the active fin patterns 13B.

In some example embodiments, the gate electrodes 37A1 and 37A2 may include polysilicon, polysilicon-germanium alloy, tungsten (W) tantalum (Ta), aluminum (Al), oxide thereof, or nitride thereof. FIG. 11 illustrates only a case in which the gate electrodes 37A1 and 37A2 are formed as a single layer structure, but an example embodiment is not limited thereto. The gate electrodes 37A1 and 37A2 may be formed as a multilayer structure.

FIGS. 12A to 12D illustrate various types of the first hard mask patterns 21B of FIGS. 8A to 8C. The first hard mask patterns 21B may be formed of various types of patterns according to a type of an individual unit element. In other words, the second hard mask pattern 25B of FIGS. 5A to 5C may include a plurality of unit mask patterns, and the second photo resist pattern 31 of FIGS. 7A to 7C may include a plurality of unit resist patterns.

In detail, referring to FIGS. 4A to 4C, and FIG. 12A, the first photo resist pattern 29 may include two of the unit resist patterns formed so as to overlap two active fins respectively, which are separated from each other and between which at least two of the active fins 13A are interposed. Referring to FIGS. 5A to 5C, and FIG. 12A, the second hard mask pattern 25B may include two of the unit mask patterns according to two of the unit resist patterns of the first photo resist pattern 29. Referring to FIGS. 6A to 6C, and FIG. 12A, two of the unit mask patterns of the trimmed second hard mask pattern 25C may be formed to respectively overlap the active fins separated from each other. Referring to FIGS. 7A to 7C, and FIG. 12A, the second photo resist pattern 31 may overlap at least two of the active fins. Afterwards, first hard mask patterns 37B of FIG. 12A may be formed by using the two unit mask patterns of the trimmed second hard mask pattern 25C and the second photo resist pattern 31 as an etching mask.

Figure 12A:
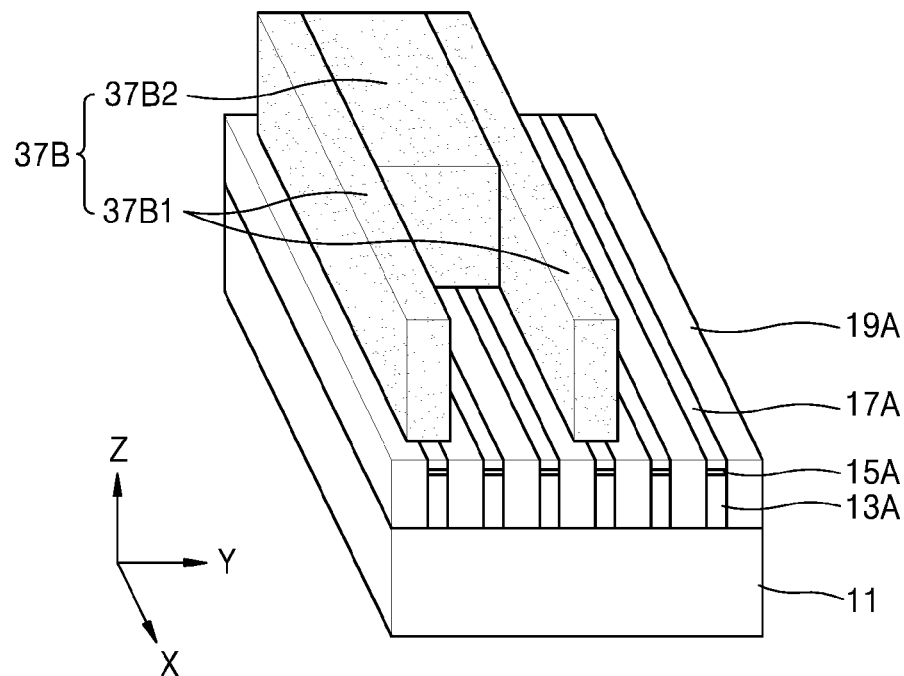
FIGS. 12A to 12D are perspective views illustrating a method of manufacturing a semiconductor device, according to at least one example embodiment of the inventive concepts.
Figure 12B:
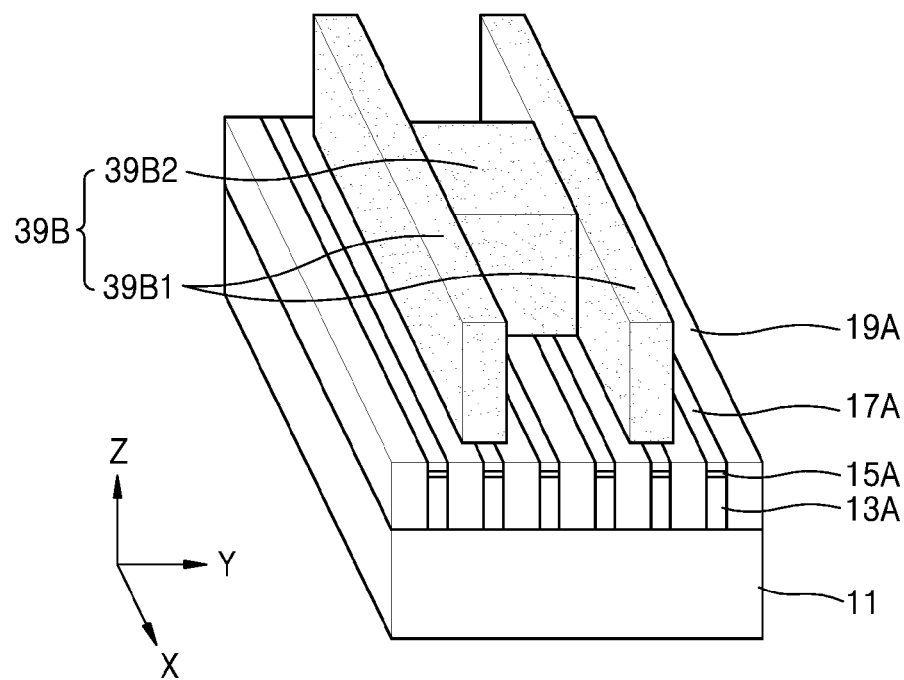

Referring to FIG. 12B, first hard mask patterns 39B are similar to the first hard mask patterns 37B of FIG. 12A, and may be different from the first hard mask patterns 37B of FIG. 12A with regard to a relative position of a first pattern region 39B1 defined by the two unit mask patterns of the trimmed second hard mask pattern 25C and a second pattern region 39B2 defined by the second photo resist pattern 31, compared to a relative position of a first pattern region 37B1 and a second pattern region 37B2 of FIG. 12A.

Figure 12C:
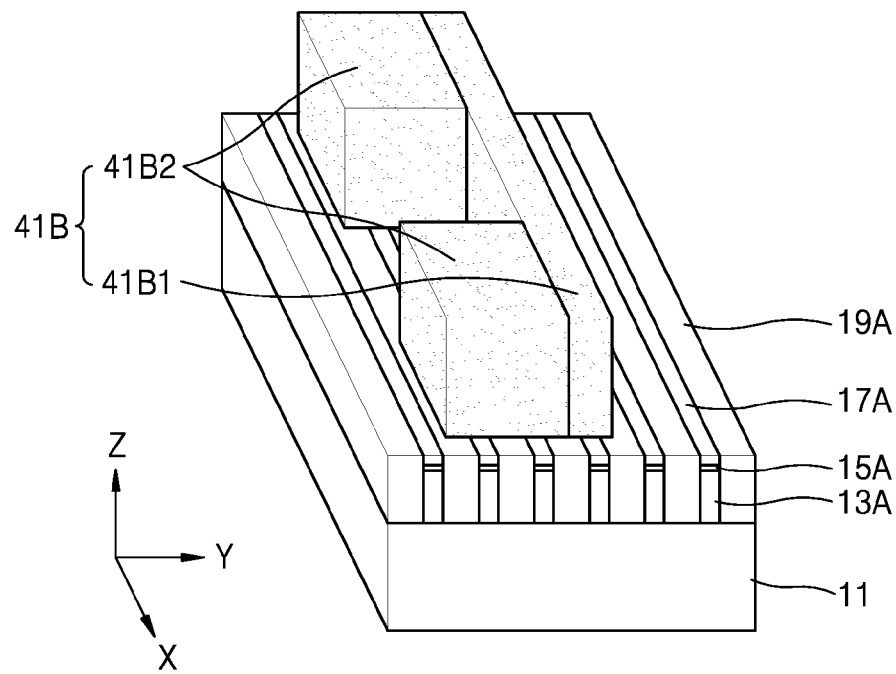

Referring to FIG. 12C, first hard mask patterns 41B may have a hard mask pattern 41B1 with reference to the trimmed second hard mask pattern 25C of FIGS. 4A to 6C, and two unit resist patterns 41B2.

Figure 12D:
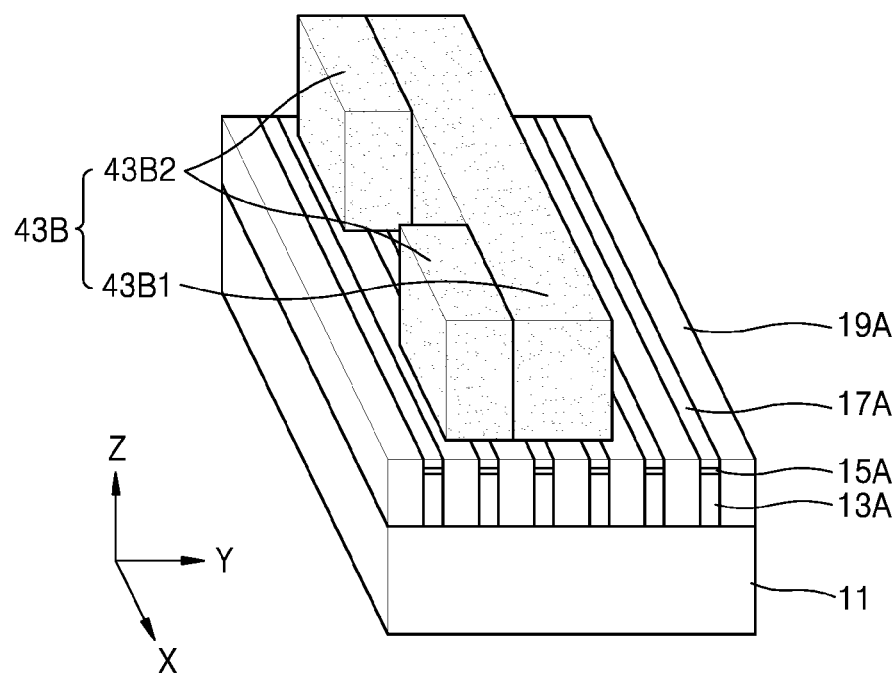

Referring to FIG. 12D, first hard mask patterns 43B are similar to the first hard mask patterns 41B of FIG. 12C, but the two unit resist patterns 41B2 with reference to the trimmed second hard mask pattern 25C of FIGS. 4A to 6C may be formed respectively in two regions which are separated from each other on one of the active fins 13A.

Other than the types in FIGS. 12A to 12D, various types of the first hard mask patterns may be formed.

Active fin patterns may be formed by etching the active fins 13A by using the first hard mask patterns 37B1, 39B1, 41B1, and 43B1 of FIGS. 12A to 12D as an etching mask. In some example embodiments, the active fin patterns may have an L shape, a C shape, or an H shape.

Figure 13:
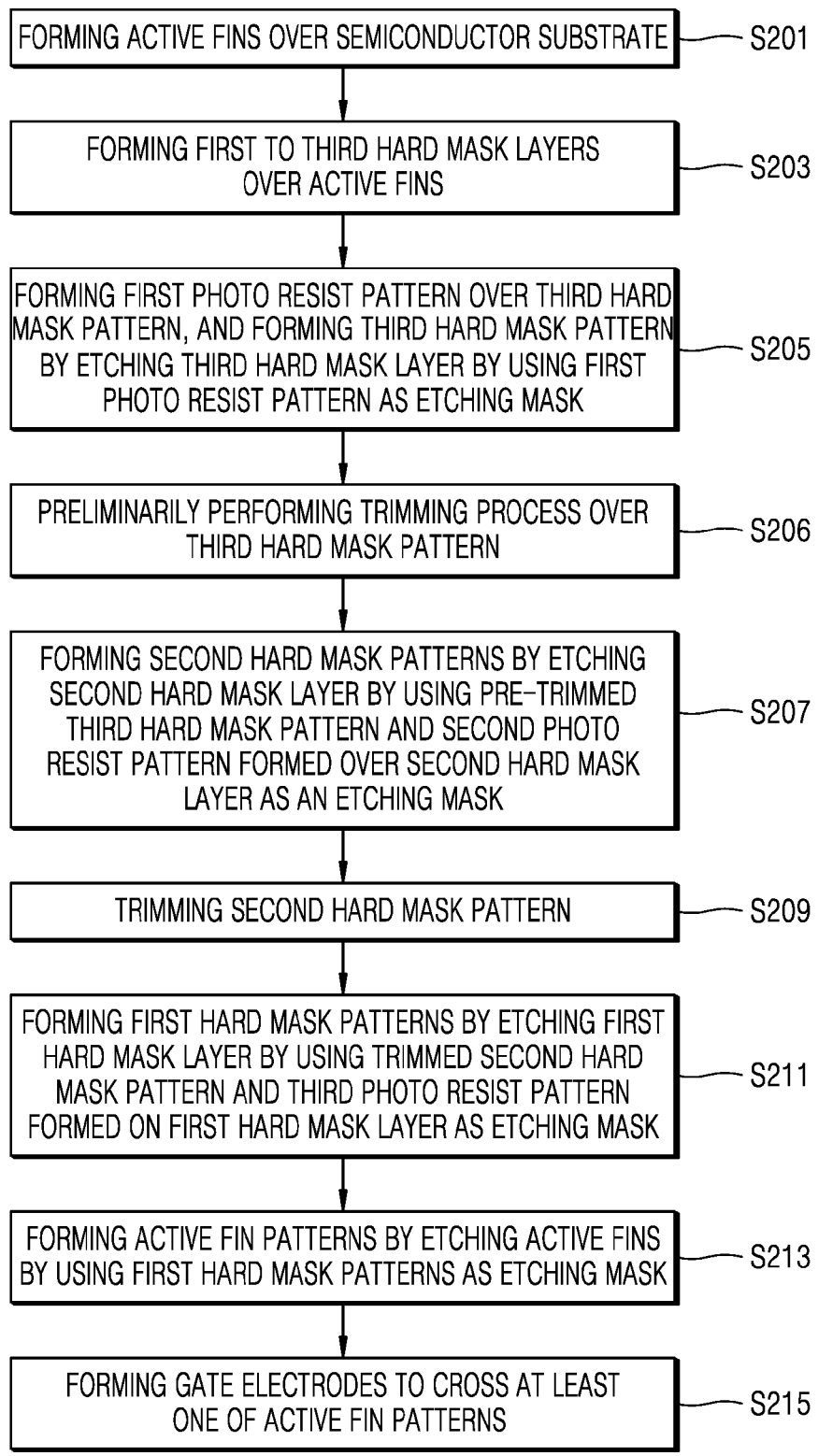
FIG. 13 is a flow chart of a method of manufacturing a semiconductor device, according to at least one example embodiment of the inventive concepts.

FIG. 13 is a flow chart of a method of manufacturing a semiconductor device, according to at least one example embodiment of the inventive concepts.

FIGS. 14 to 23 are a perspective view, planar layouts, and sectional views illustrating a method of manufacturing a semiconductor device in a process sequence, according to at least one example embodiment of the inventive concepts. FIGS. 15B, 16B, 17B, 18B, and 19B are planar layouts of FIGS. 15A, 16A, 17A, 18A, and 19A; FIGS. 15C, 16C, 17C, and 18C are sectional views taken along lines XV-XV, XVI-XVI, XVII-XVII, and XVIII-XVIII of FIGS. 15A, 16A, 17A, and 18A, respectively.

Although the manufacturing methods of FIGS. 14 to 23 are similar to those of the semiconductor devices described with reference to FIGS. 1 to 11, a third hard mask pattern 69B is applied in order to pattern active fins 54AT1 and 54AT2 adjacent to one of the active fins and trimming processes T1 and T2 are performed twice in FIGS. 14 to 23.

Figure 14:
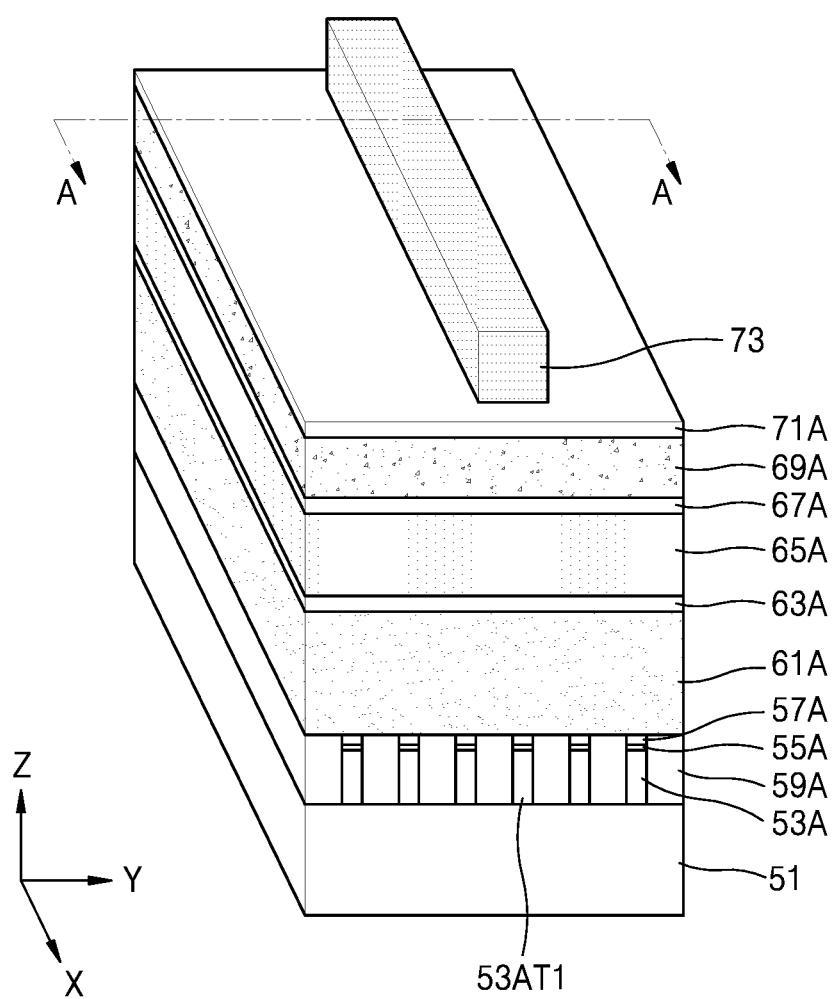
FIGS. 14 to 23 are a perspective view, planar layouts, and sectional views illustrating a method of manufacturing a semiconductor device in a process sequence, according to at least one example embodiment of the inventive concepts.
Figure 15A:
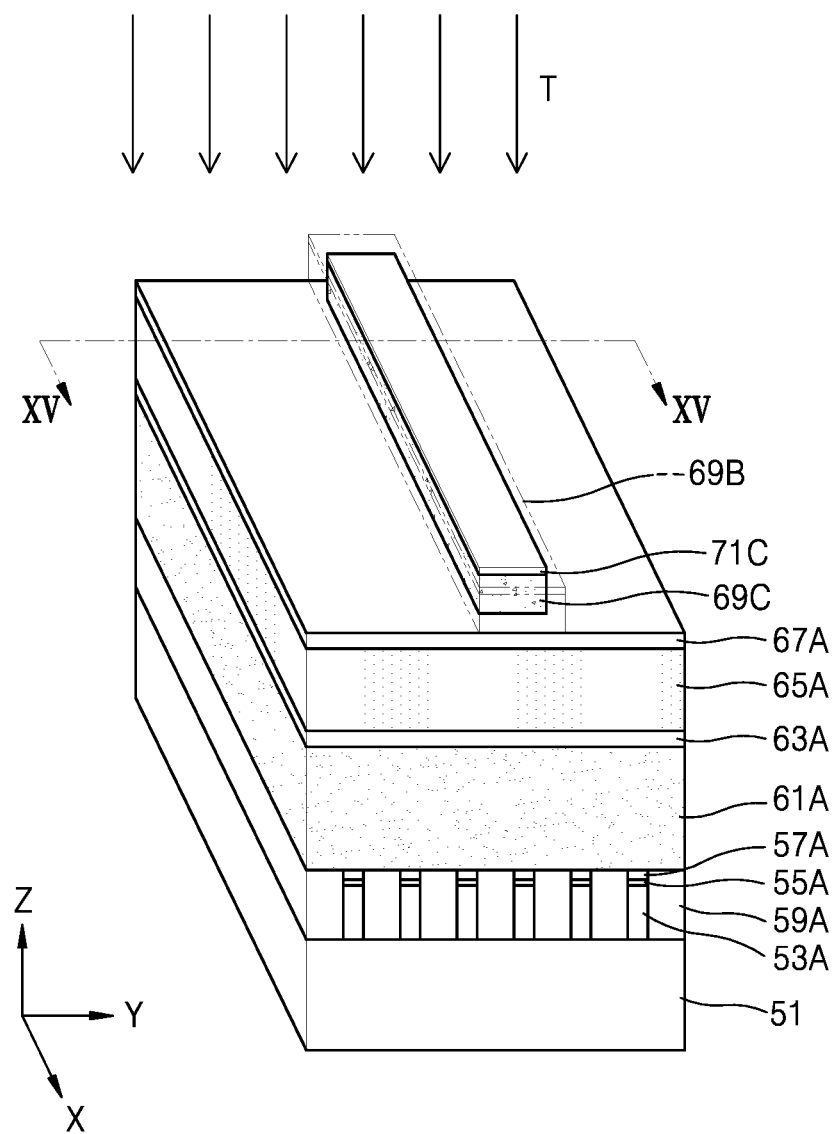
Figure 15B:
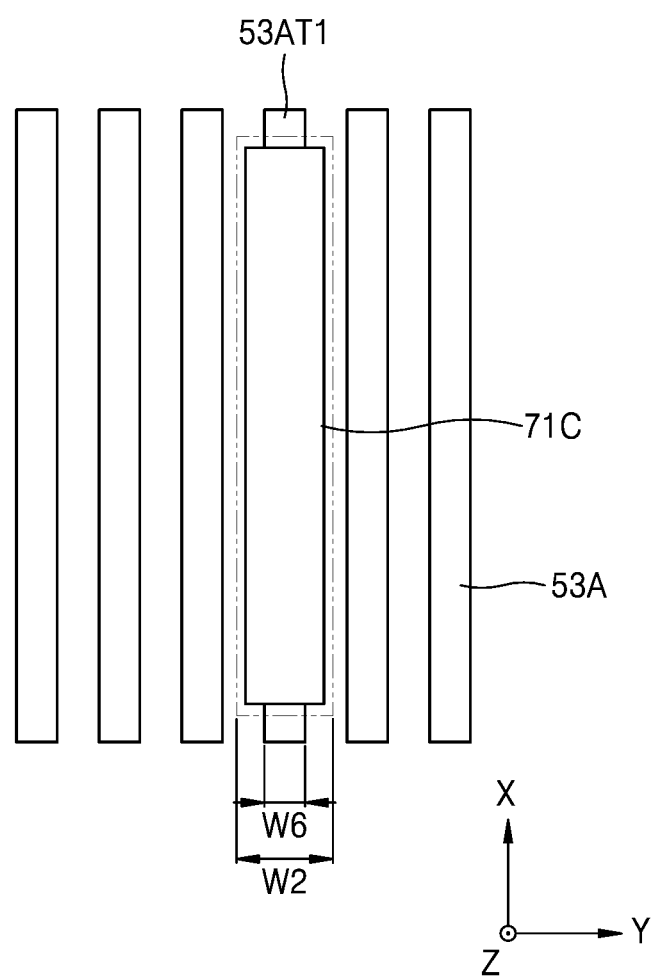
Figure 15C:
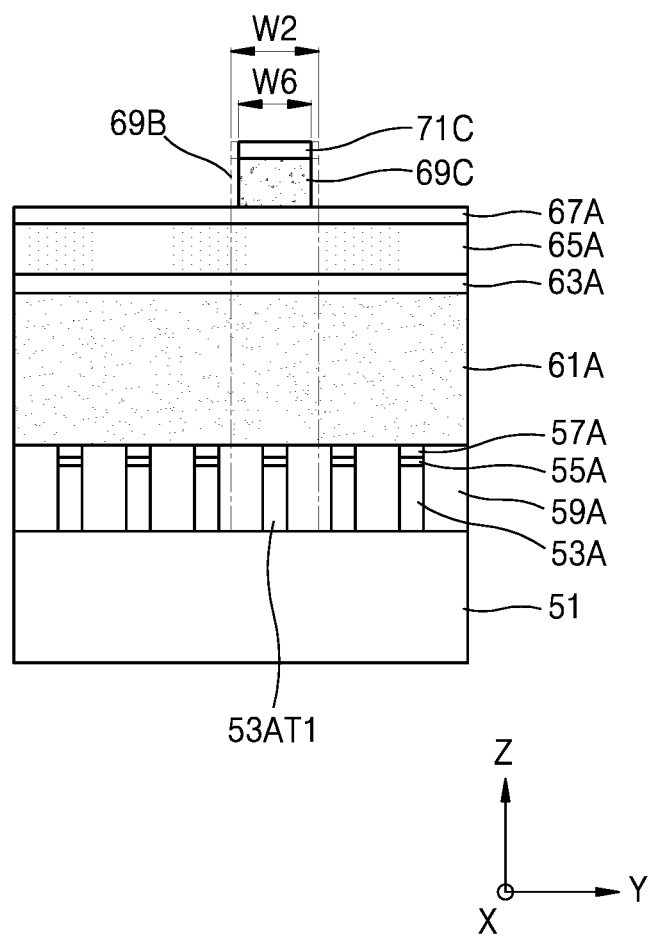
Figure 16A:
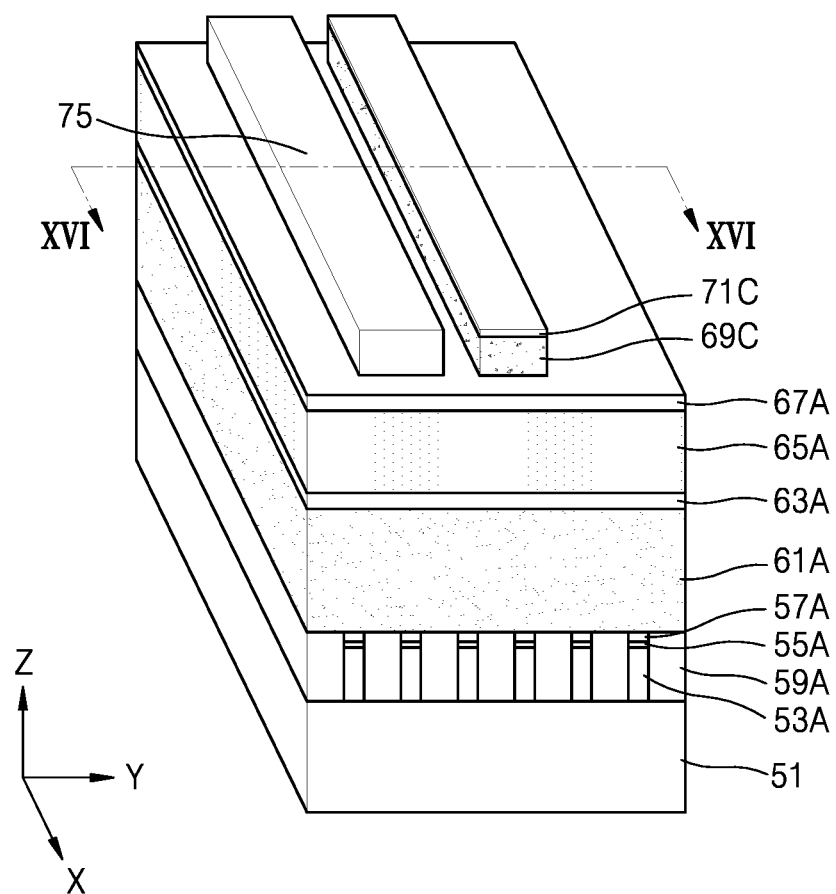
Figure 16B:
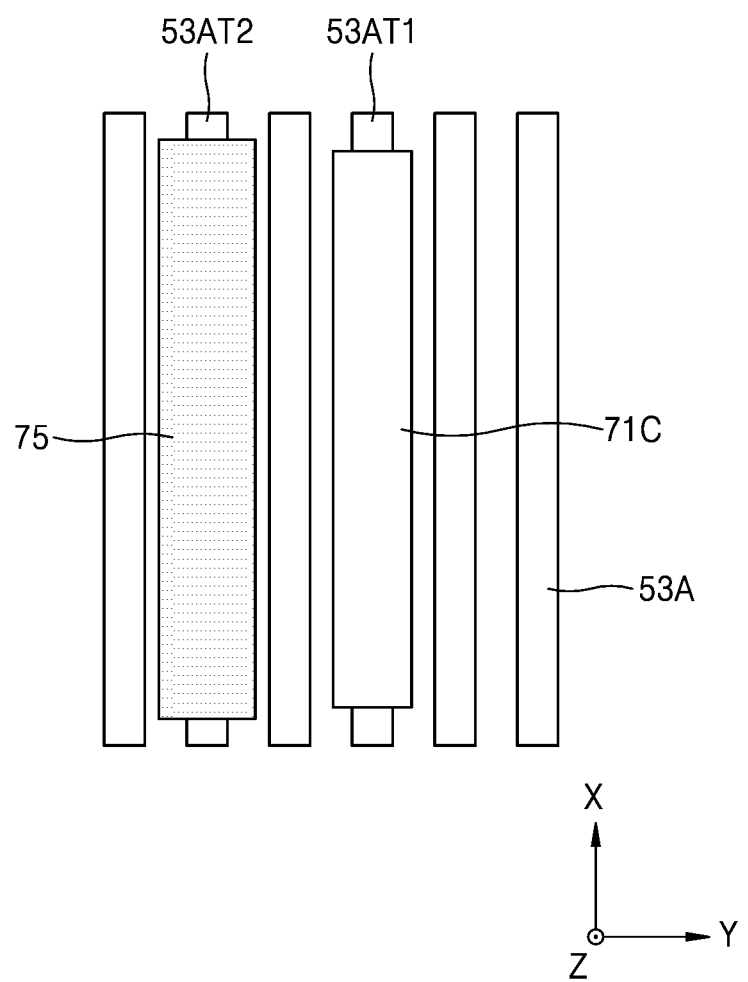
Figure 16C:
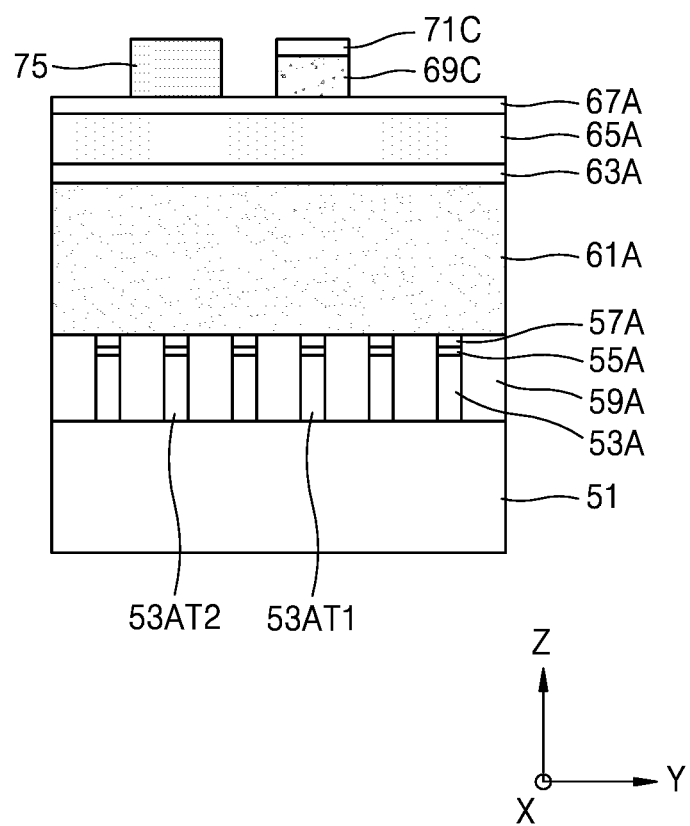
Figure 17A:
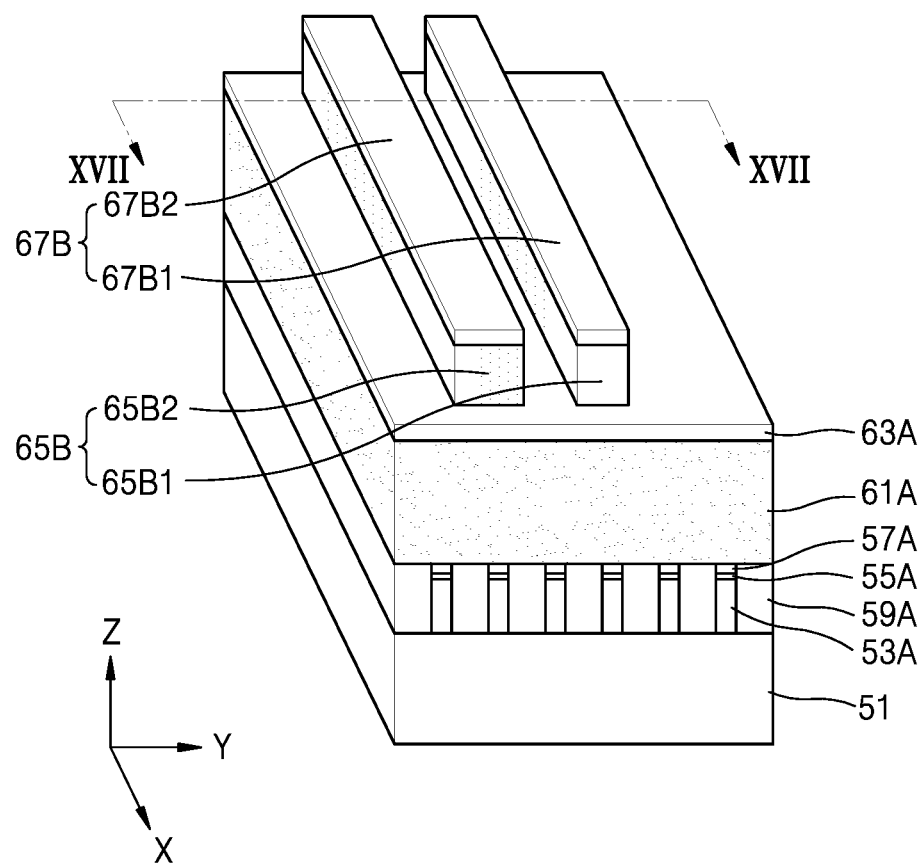
Figure 17B:
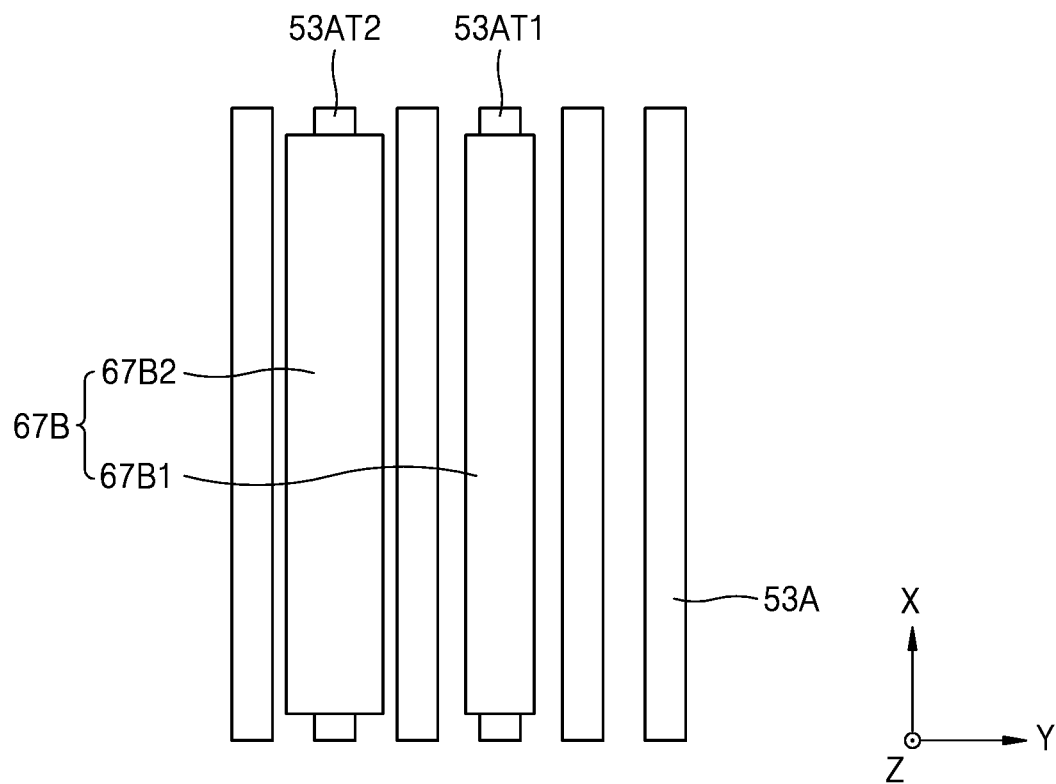
Figure 17C:
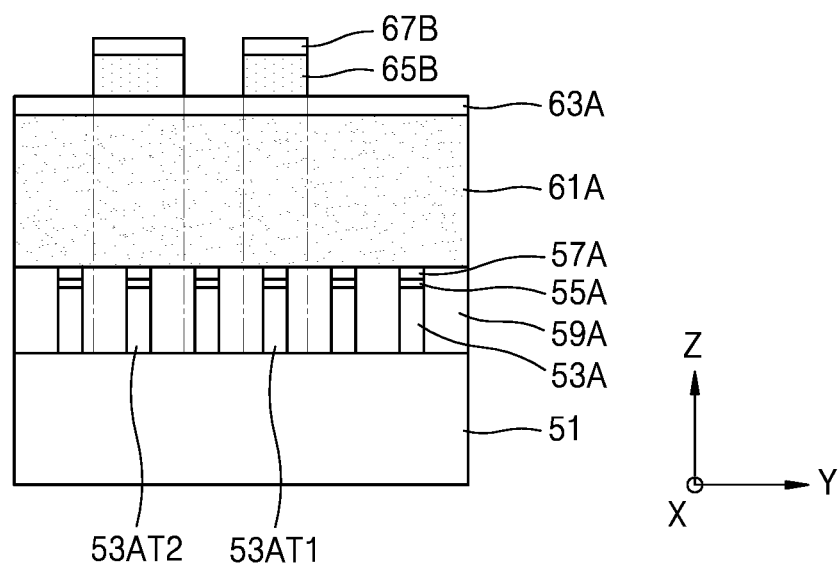
Figure 18A:
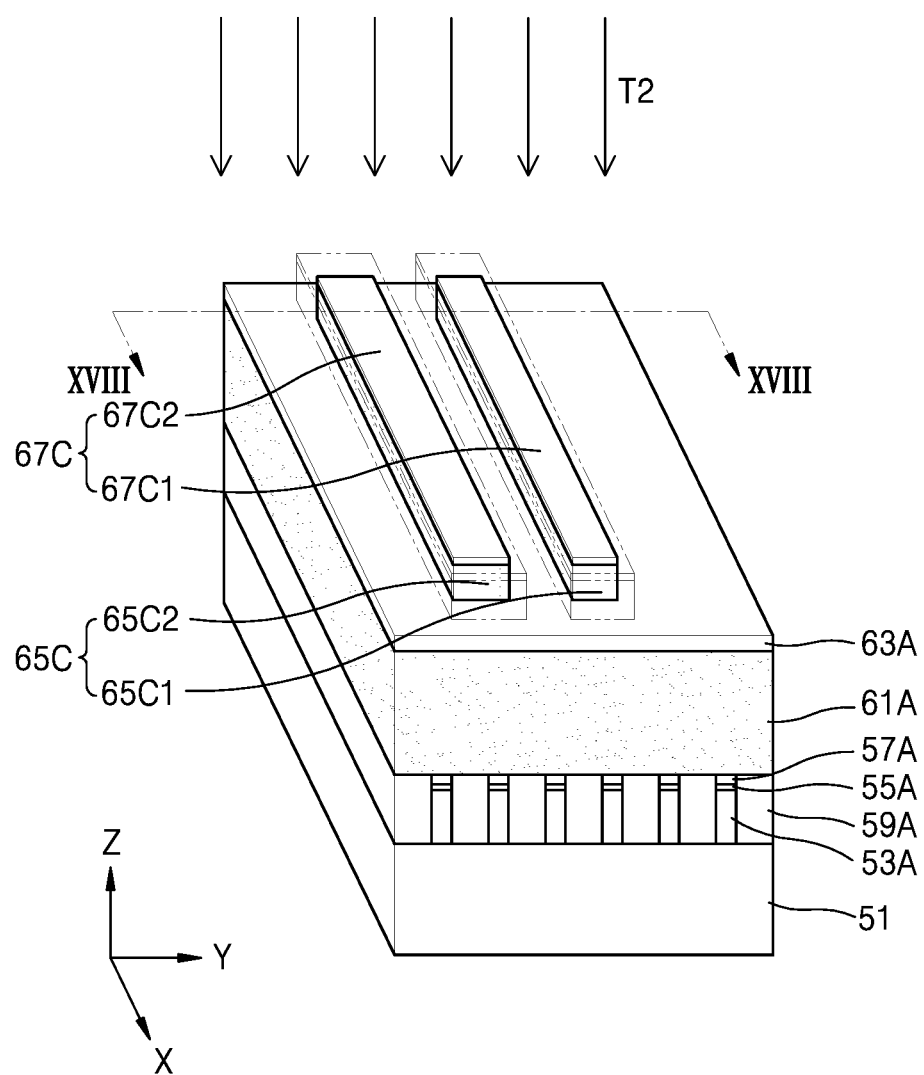
Figure 18B:
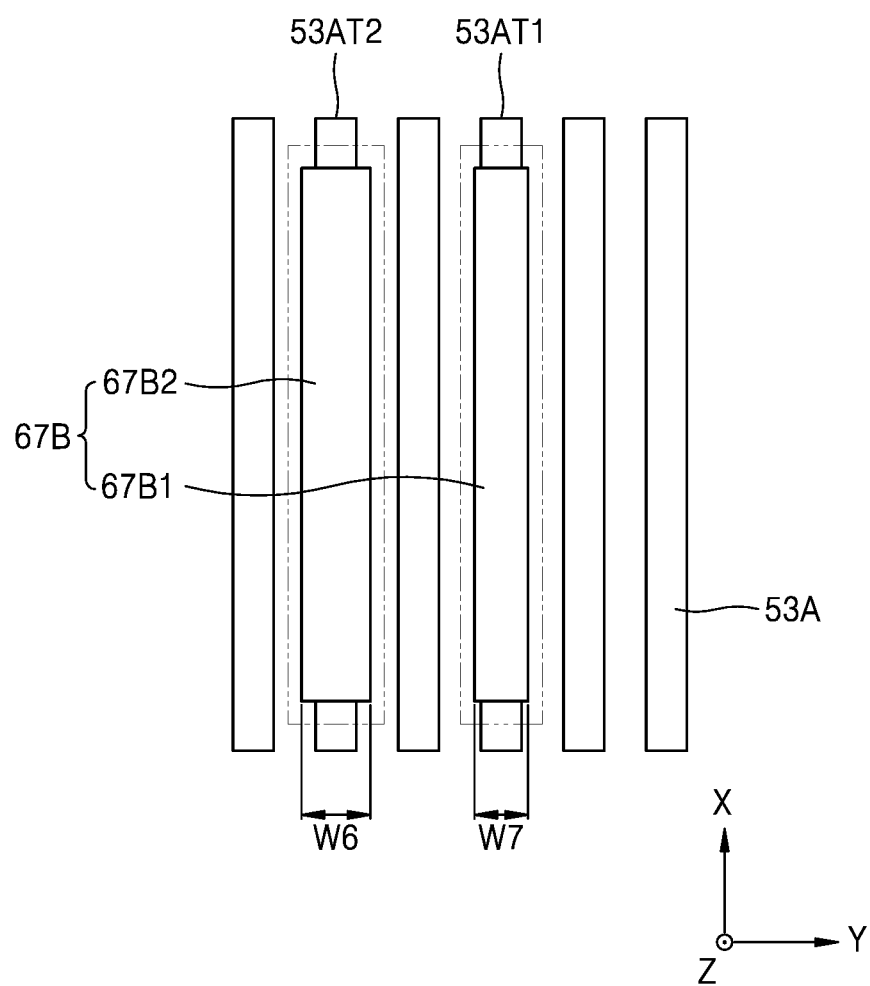
Figure 18C:
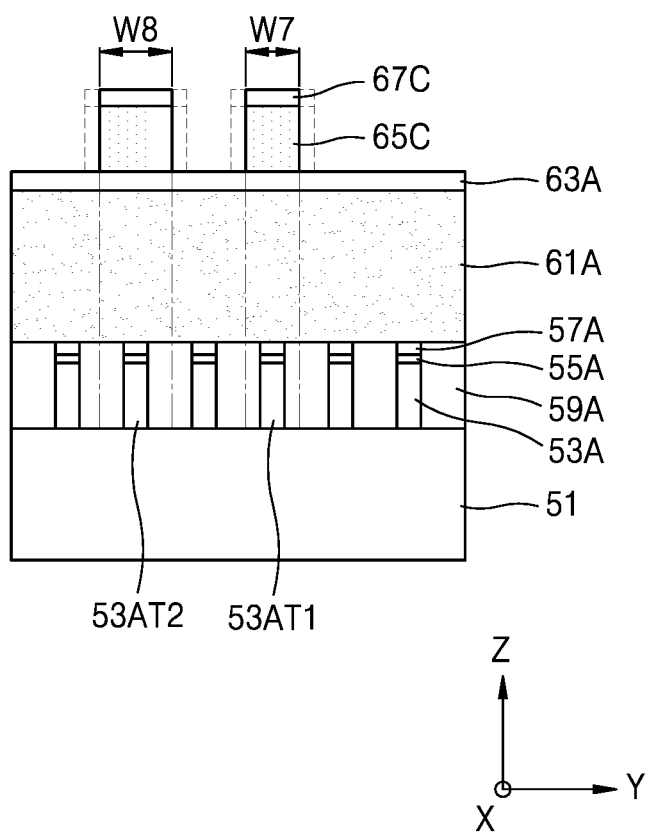

Referring to FIGS. 13 and 14, a plurality of active fins 53A are formed on a semiconductor substrate 51 during step S201, a first hard mask layer 61A, a first intermediate layer 63A, a second hard mask layer 65A, a second intermediate layer 67A, a third hard mask layer 69A, and a third intermediate layer 71A are sequentially formed over the active fins 53A during step S203, and a first photo resist pattern 73 may be formed on the third hard mask layer 69A. The first photo resist pattern 73 may be formed so as to overlap an active fin 53AT1.

A first insulating film 55A, a second insulating film 57A, and a first element isolation film 59A may correspond to the first insulating films 15A, the second insulating films 17A, and the first element isolation films 19A described with reference to FIGS. 2 to 8C.

Referring to FIG. 13 and FIGS. 15A to 15C, the third hard mask pattern 69B may be formed by etching the third hard mask layer 69A by using the first photo resist pattern 73 of FIG. 14 as an etching mask during step S205. Afterwards, it is possible to reduce the line width W2 of the third hard mask pattern 69B by performing the trimming process T1 preliminarily on the third hard mask pattern 69B during step S206. A line width W6 of a pre-trimmed third hard mask pattern 69C may be formed to have a dimension capable of preventing and/or reducing overlapping with a second photo resist pattern 75 of FIGS. 16A to 16C that will be described below, which are formed adjacent to the pre-trimmed third hard mask pattern 69C. A third intermediate pattern 71C is formed over the pre-trimmed third hard mask pattern 69C.

Referring to FIG. 13 and FIGS. 16A to 16C, the second photo resist pattern 75 may be formed over the second hard mask layer 65A. The second photo resist pattern 75 may be formed to overlap an active fin 53AT2.

Referring to FIG. 13 and FIGS. 17A to 17C, second hard mask patterns 65B may be formed by etching the second hard mask layer 65A by using the pre-trimmed third hard mask pattern 69B and the second photo resist pattern 75 formed over the second hard mask layer 65A as an etching mask during step S207. Second intermediate patterns 6713 are formed over the second hard mask patterns 65B.

Referring to FIG. 13 and FIGS. 18A to 18C, the trimming process T2 are performed over the second hard mask patterns 65B during step S209. Trimmed second hard mask patterns 65C may be divided into a first pattern region 67C1 overlapping the pre-trimmed third hard mask pattern 69C, and a second pattern region 67C2 not including the first pattern region 67C1 from the trimmed second hard mask patterns 65C. A line width W7 of the first pattern region 67C1 on which the pre-trimming process T1 was performed may be less than a line width W8 of the second pattern region 67C2. The first pattern region 67C1 and the second pattern region 67C2 may be separated from each other and at least one of the active fins 53A from among the active fins 53A may be interposed between them. Trimmed second intermediate patterns 67C may be formed on the trimmed second hard mask patterns 65C.

Referring to FIG. 13 and FIGS. 19A to 19C, a third photo resist pattern 77 may be formed over the first hard mask layer 61A. The third photo resist pattern 77 may be formed to overlap at least one of the active fins 53A between the trimmed second hard mask patterns 65C.

Figure 19A:
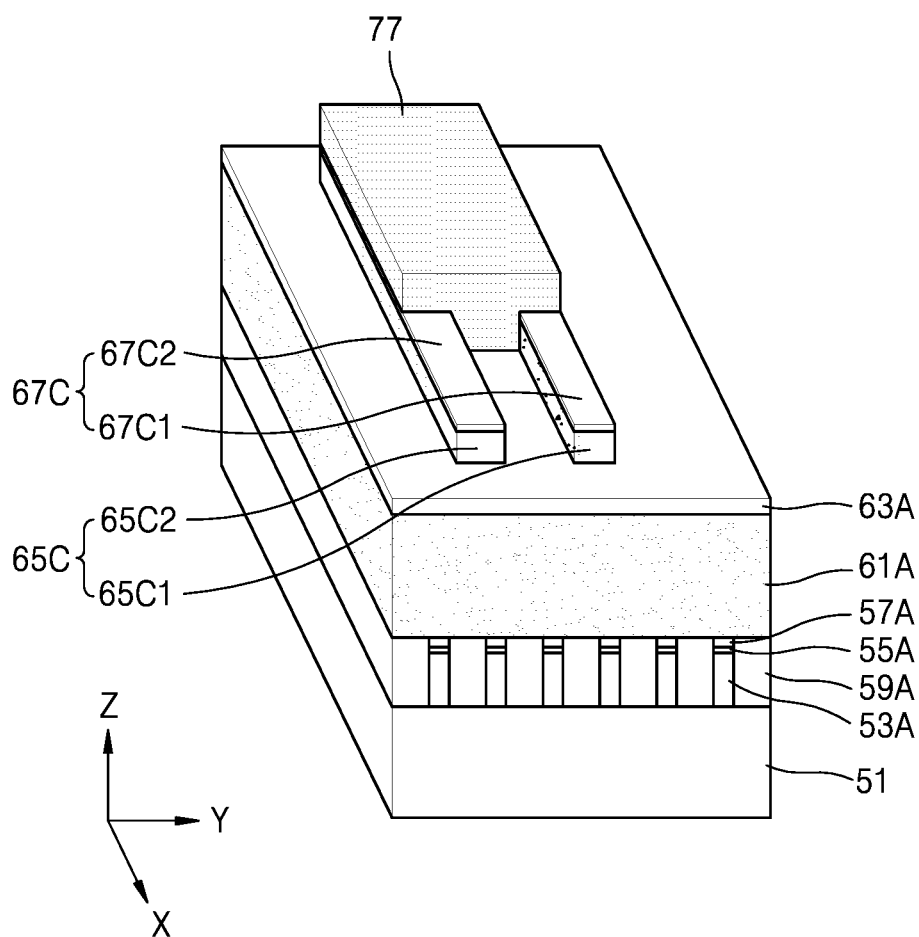
Figure 19B:
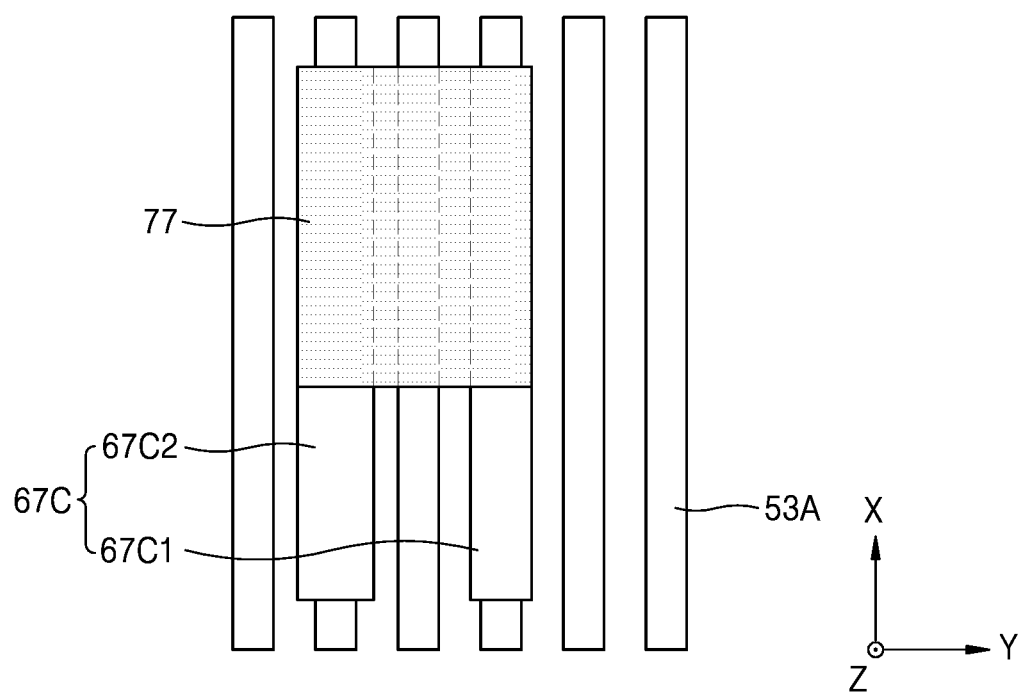
Figure 19C:
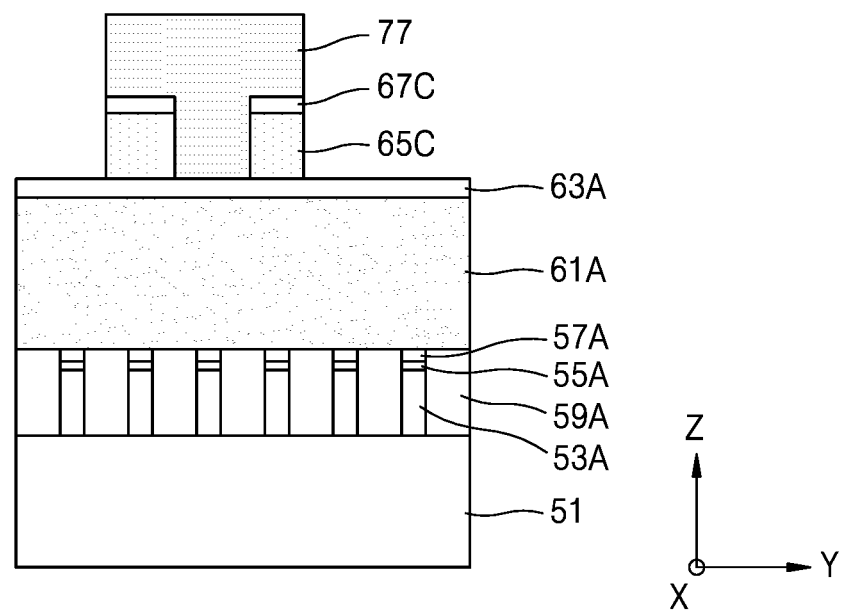
Figure 20A:
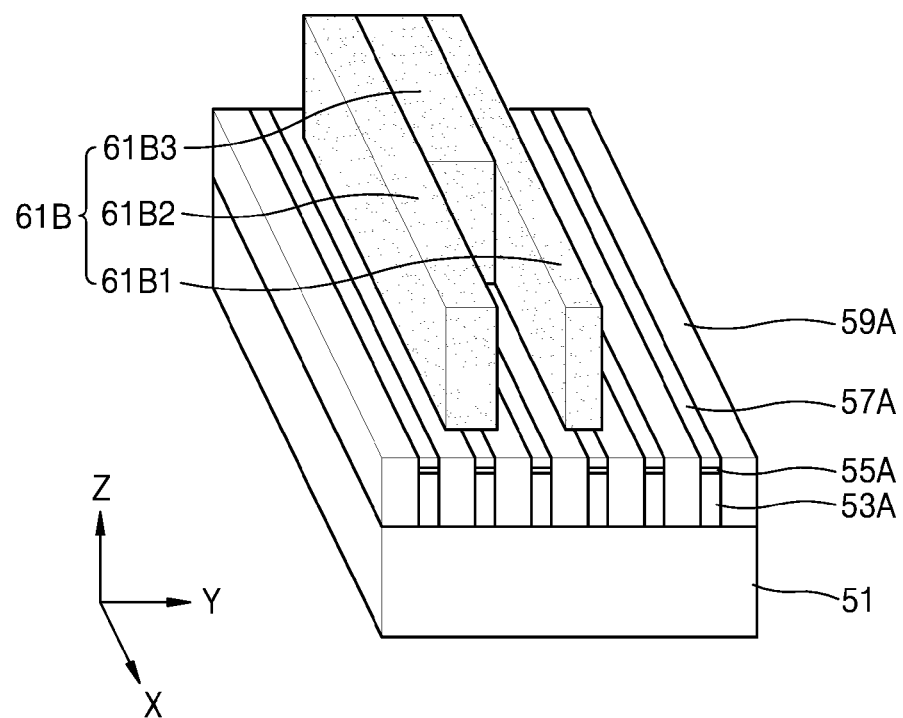
Figure 20B:
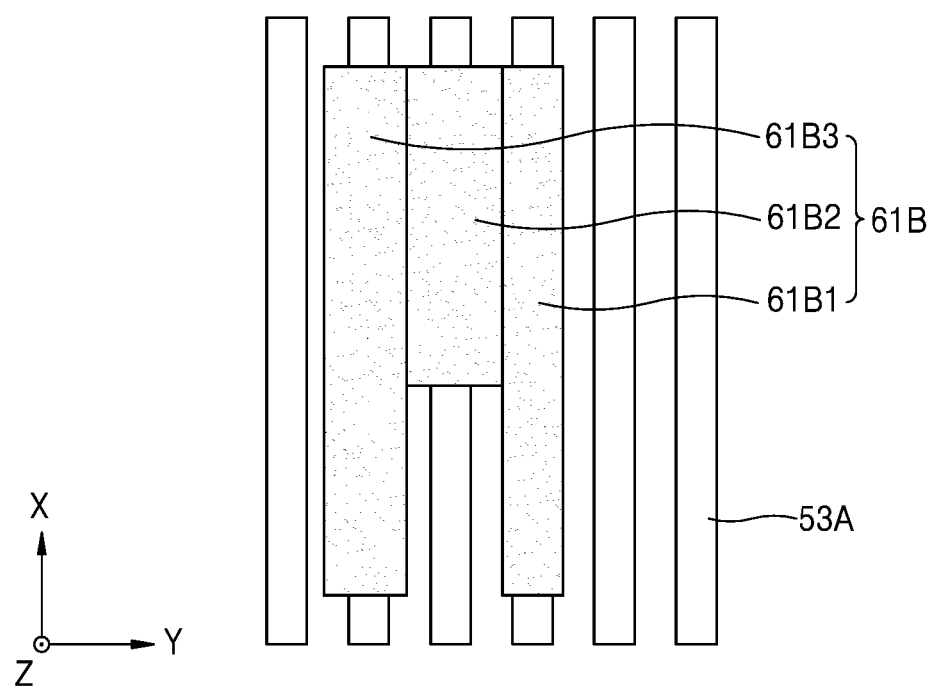

Referring to FIG. 13 and FIGS. 20A to 20B, first hard mask patterns 61B may be formed by etching the first hard mask layer 61A by using the trimmed second hard mask patterns 65C and the third photo resist pattern 77 of FIGS. 19A to 19C as an etching mask during step S211.

Figure 21:
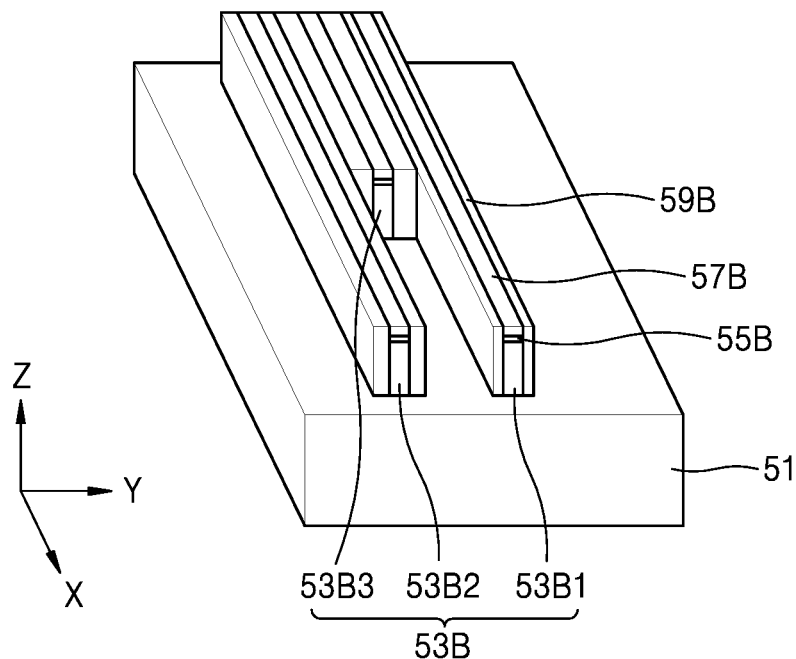

Referring to FIGS. 13 and 21, active fin patterns 53B including patterned active fins 53B1 and 53B2 may be formed by etching the active fins 53A by using the first hard mask patterns 61B as an etching mask during step S213. Afterwards, insulating patterns 55B and 57B, and an element isolation pattern 59B may be removed.

Figure 22:
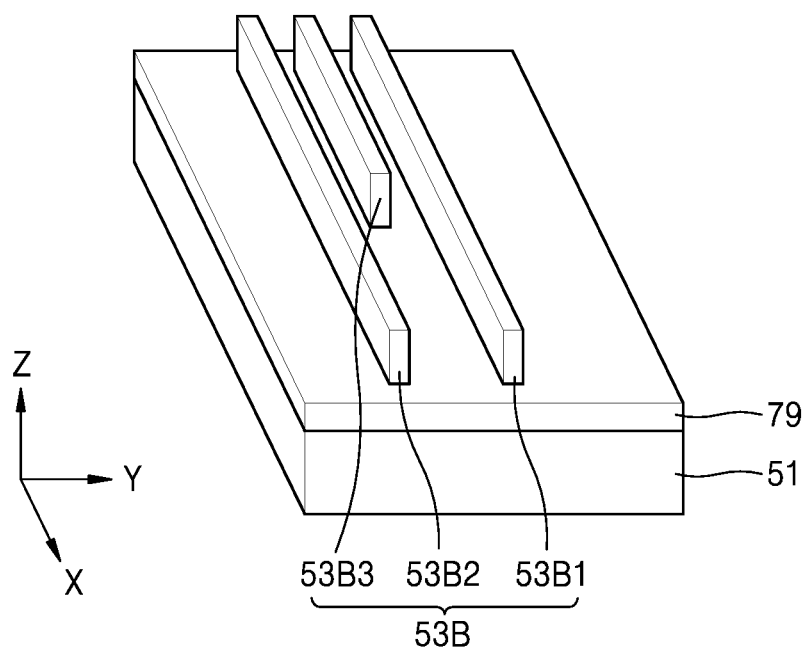

Referring to FIGS. 13 and 22, a second element isolation film 79 may be filled between the active fin patterns 53B while overlapping the upper surface of the semiconductor substrate 51.

Figure 23:
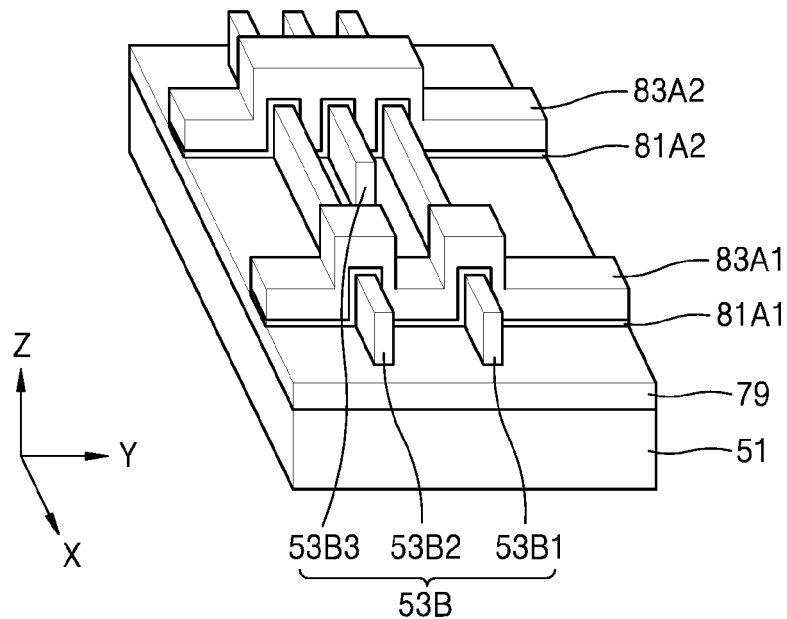

Referring to FIGS. 13 and 23, gate electrodes 83A1 and 83A2 may be formed to cross at least one of the active fins 53B1 and 53B2 forming the active fin patterns 53B during step S215. The gate electrodes 83A1 may be formed to cross active fins 53B1 and 53B2 and a gate dielectric layer 81A1 is disposed between gate electrodes 83A1 and active fins 53B1 and 53B2. Furthermore, the gate electrodes 83A2 may be formed to cross active fins 53B1, 53B2, and 53B3 and a gate dielectric layer 81A2 is disposed between the gate electrodes 83A2 and the active fins 53B1 and 53B2. A second element isolation film 79 may correspond to the second element isolation film 33 described with reference to FIGS. 10 and 11.

The patterning of one of the active fins 53A adjacent to each other, interposing one of the active fins by performing the trimming processes T1 and T2 selectively with respect to the hard mask layers 65A and 69A from among the hard mask layers 61A, 65A, and 69A, was described with reference to FIGS. 13 to 23 but technical ideas of at least one example embodiment of the inventive concepts are not limited thereto. In at least one example embodiment, the first hard mask layer 61A may be a final hard mask layer, and preliminary hard mask patterns patterned by at least one of the hard mask layers 65A and 69A over the first hard mask layer 61A may be sequentially formed. Afterwards, the trimming process T2 may be performed on the preliminary hard mask patterns. The third photo resist pattern 77 may be formed over the final hard mask layer, and final hard mask patterns may be formed by using the trimmed preliminary hard mask patterns and the photo resist pattern 77 as an etching mask. Thus, a semiconductor device may be formed by etching the active fins 53A by using the final hard mask patterns as an etching mask. In this case, the trimmed preliminary hard mask patterns may overlap one of the active fins 53A. In this case, the photo resist pattern 77 may overlap at least two of the active fins 53A.

Figure 24:
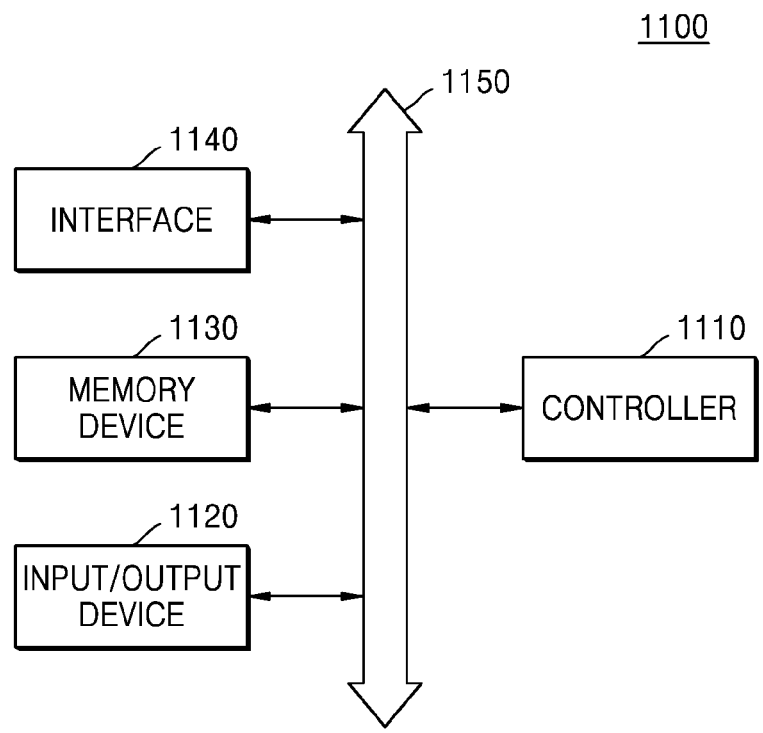
FIG. 24 is a block diagram of a system manufactured by a method of manufacturing a semiconductor device, according to at least one example embodiment of the inventive concepts.

FIG. 24 is a block diagram of a system manufactured by a method of manufacturing a semiconductor device, according to at least one example embodiment of the inventive concepts.

Referring to FIG. 24, an electronic system 1100 may include a controller 1110, input/output device 1120, the memory device 1130, and an interface 1140. The electronic system 1100 may be a mobile system or an electronic system for transmitting/receiving information. In some example embodiments, the mobile system may include a PDA, a portable computer, a web tablet, a wireless phone, a mobile phone, a digital music player, or a memory card. The controller 1110, which is configured to control an execution program in the electronic system 1100, may include a microprocessor, a digital signal processor, a micro controller, or a device similar thereto. The input/output device 1120 may input or output data of the electronic system 1100. The electronic system 1100 may be connected to an external device, such as a personal computer or a network, via the input/output device 1120 so as to exchange data with the external device. The input/output device 1120 may include a keypad, a keyboard, or a display.

The memory device 1130 may store code and/or data for an operation of the controller 1110, and/or may store data processed by the controller 1110.

The interface 1140 may be a data transmission path between the electronic system 1100 and another external device. The controller 1110, the input/output device 1120, the memory device 1130, and the interface 1140 may communicate with each other via a bus 1150. The electronic system 1100 may be used for a mobile phone, an MP3 player, a navigation system, a portable multimedia player (PMP), a solid state disk (SSD), or household appliances. The controller 1110 may include a semiconductor device according to at least one example embodiment of the inventive concepts. For example, the controller 1110 may include at least one of the semiconductor devices formed by the methods of manufacturing the semiconductor devices of FIGS. 1 to 23.

Figure 25:
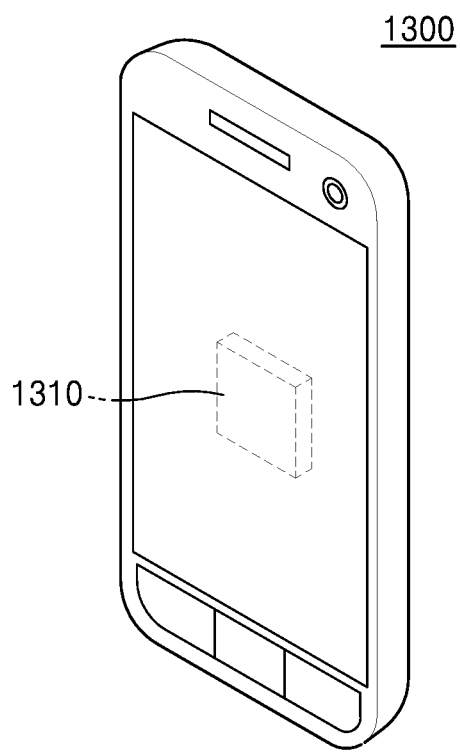
FIG. 25 is a schematic perspective view of an electronic device manufactured by a method of manufacturing a semiconductor device, according to at least one example embodiment of the inventive concepts.

FIG. 25 is a schematic perspective view of an electronic device manufactured by a method of manufacturing a semiconductor device, according to at least one example embodiment of the inventive concepts.

FIG. 25 illustrates an example embodiment of the electronic system 1100 of FIG. 24 used in a mobile phone 1300. The mobile phone 1300 may include a semiconductor device 1310. The semiconductor device 1310 may include at least one of the semiconductor devices formed by the methods of manufacturing the semiconductor devices of FIGS. 1 to 23. The semiconductor device 1310 may be a semiconductor device such as a mobile application processor (AP), microprocessor unit (MPU), etc.

The mobile phone 1300 may include the semiconductor device 1310. Accordingly, the degree of freedom in designing the semiconductor device and the operating reliability thereof increase and thus, miniaturization and high-performance of the mobile phone 1300 may be achieved.

While at least one example embodiment of the inventive concepts has been particularly shown and described, it will be understood that various changes in form and details may be made therein without departing from the spirit and scope of the following claims.

What is claimed is:

1. A method of manufacturing a semiconductor device, the method comprising:
    forming a plurality of active fins over a semiconductor substrate;
    sequentially forming a first hard mask layer and a second hard mask layer over the active fins;
    etching the second hard mask layer to form a second hard mask pattern;
    trimming the second hard mask pattern to form a trimmed hard mask pattern;
    forming a first photo resist pattern over the first hard mask layer;
    etching the first hard mask layer by using the trimmed hard mask pattern and the first photo resist pattern as an etching mask to form first hard mask patterns; and
    etching the active fins by using the first hard mask patterns as an etching mask to form active fin patterns.

2. The method of claim 1, wherein the trimmed hard mask pattern comprises: at least one unit mask pattern, the unit mask pattern overlapping an active fin from among the active fins.

3. The method of claim 2, wherein the trimming forms the trimmed hard mask pattern to include a plurality of unit mask patterns and the unit mask patterns respectively overlap the active fins that are separated from each other and between which at least two of the active fins are interposed.

4. The method of claim 2, wherein the trimming forms the trimmed hard mask pattern to completely overlap an upper surface of the active fin along a line width direction of the active fin.

5. The method of claim 1, wherein a line width of the trimmed hard mask pattern is less than a line width of the second hard mask pattern.

6. The method of claim 1, wherein the first photo resist pattern comprises:
    at least one unit resist pattern, the unit resist pattern overlapping at least two of the active fins.

7. The method of claim 1, wherein a line width of the trimmed hard mask pattern is less than pitches between the active fins.

8. The method of claim 1, wherein the first photo resist pattern partially overlaps the trimmed hard mask.

9. The method of claim 1, wherein the first hard mask patterns are divided into:
a first pattern region; and
a second pattern region defined by the trimmed hard mask pattern, the first pattern region not including the second pattern region from among the second hard mask patterns; and wherein
a line width of the second pattern region is equal to or less than a half of a line width of the first pattern region.

10. The method of claim 1, wherein the etching the active fins forms the active fin patterns to extend in parallel with each other along a first direction, and
the active fin patterns are divided into,
a first active fin region; and
a second active fin region overlapping the trimmed hard mask pattern, the first active fin region not including the second active fin region from among the active fin patterns, wherein
an end of the first direction in the second active fin region projects more than an end of the first direction in the first active fin region.

11. The method of claim 1, wherein the first hard mask patterns have one of an L shape, a C shape, and an H shape.

12. The method of claim 1, further comprising:
forming a gate electrode crossing at least one of the active fin patterns, after the forming active fin patterns.

13. The method of claim 12, wherein the active fin patterns are divided into:
a first active fin region; and
a second active fin region overlapping the trimmed hard mask pattern, the first active fin region not including the second active fin region from among the active fin patterns, wherein a plurality of the gate electrodes are formed and at least one of the gate electrodes crosses both of the first and second active fin regions, and at least one of the gate electrodes crosses any one of the first or second active fin regions.

14. The method of claim 1, wherein the forming of the second hard mask pattern comprises:
forming a third hard mask layer over the second hard mask layer;
forming a third hard mask pattern by etching the third hard mask layer;
performing a pre-trimming process over the third hard mask pattern;
forming a second photo resist pattern over the second hard mask layer; and
etching the second hard mask layer by using
a pre-trimmed third hard mask pattern and the second photo resist pattern as an etching mask to form the second hard mask pattern.

15. A method of manufacturing a semiconductor device, the method comprising:
forming a hard mask layer over active fins;
forming a hard mask pattern over the hard mask layer, the hard mask pattern completely overlapping one of the active fins along a line width direction;
trimming the hard mask pattern so as to have a first line width;
forming a photo resist pattern, the photo resist pattern overlapping at least two of the active fins over the hard mask layer and having a second line width greater than the first line width; and
patterning the active fins by using the trimmed hard mask pattern and the photo resist pattern as an etching mask.

16. A method of manufacturing a semiconductor device, the method comprising:
forming a plurality of active fins on a substrate;
forming a hard mask layer over a targeted one of the plurality of active fins;
forming a first hard mask pattern over the hard mask layer; and
trimming the first hard mask pattern, the first hard mask pattern having a width that covers only the targeted one of the active fins.

17. The method of claim 16, further comprising:
forming a plurality of hard mask patterns simultaneously with the forming a first hard mask pattern, each of the plurality of hard mask patterns covering at least a selected one of the plurality of active fins.

18. The method of claim 17, wherein a line width of each of the plurality of hard mask patterns is greater than or equal to a line width of the selected one of the plurality of active fins.

19. The method of claim 18, wherein the plurality of hard mask patterns are not trimmed.

20. The method of claim 17, further comprising:
trimming at least one of the plurality of hard mask patterns.

* * * * *